(12) United States Patent
Seo et al.

(10) Patent No.: US 10,775,943 B2
(45) Date of Patent: Sep. 15, 2020

(54) PRESSURE SENSOR, TOUCH INPUT DEVICE INCLUDING SAME, AND PRESSURE DETECTION METHOD USING SAME

(71) Applicant: HiDeep Inc., Seongnam-si, Gyeonggi-do (KR)

(72) Inventors: Bong Jin Seo, Seongnam-si (KR); Jae Bum Jun, Seongnam-si (KR); Hwan Hee Lee, Seongnam-si (KR); Bon Kee Kim, Seongnam-si (KR); Sang Sic Yoon, Seongnam-si (KR); Myung Jun Jin, Seongnam-si (KR)

(73) Assignee: HiDeep Inc. (KR)

( * ) Notice: Subject to any disclaimer, the term of this patent is extended or adjusted under 35 U.S.C. 154(b) by 0 days.

(21) Appl. No.: 16/091,565

(22) PCT Filed: Apr. 5, 2016

(86) PCT No.: PCT/IB2016/051916
§ 371 (c)(1),
(2) Date: Oct. 5, 2018

(87) PCT Pub. No.: WO2017/175029
PCT Pub. Date: Oct. 12, 2017

(65) Prior Publication Data
US 2019/0121465 A1    Apr. 25, 2019

(51) Int. Cl.
*G06F 3/045* (2006.01)
*G06F 3/044* (2006.01)
(Continued)

(52) U.S. Cl.
CPC .............. *G06F 3/044* (2013.01); *G01L 1/146* (2013.01); *G01L 9/0072* (2013.01);
(Continued)

(58) Field of Classification Search
CPC ...... G06F 3/041; G06F 3/0414; G06F 3/0416; G06F 3/044; G06F 2203/40105; G02F 1/13338; G01L 1/146; G01L 9/0072
See application file for complete search history.

(56) References Cited

U.S. PATENT DOCUMENTS 9,262,031 B1 *  2/2016  Moon ..................... G06F 3/044
9,501,195 B1 * 11/2016  Kim ..................... G02F 1/13338
(Continued)

FOREIGN PATENT DOCUMENTS

JP    2013142613    7/2013
JP    201635736    3/2016
(Continued)

OTHER PUBLICATIONS

International Search Report for corresponding Application No. PCT/IB2016/051916, dated Jun. 21, 2016. WO.

*Primary Examiner* — Joe H Cheng
(74) *Attorney, Agent, or Firm* — The Belles Group, P.C.

(57) ABSTRACT

A touch input device capable of detecting a pressure of a touch on a touch surface may be provided that includes: a display module; and a pressure sensor which is disposed at a position where a distance between the pressure sensor and a reference potential layer is changeable according to the touch on the touch surface. The distance is changeable according to a pressure magnitude of the touch. The pressure sensor outputs a signal including information on a capacitance which is changed according to the distance. The pressure sensor includes a plurality of electrodes to form a plurality of channels. The pressure magnitude of the touch is detected on the basis of a change amount of the capacitance detected in each of the channels. According to the embodiment of the present invention, it is possible to provide a pressure sensor for pressure detection, a touch input device including the same, and a pressure detection method using (Continued)

the same. In addition, according to the embodiment of the present invention, it is possible to provide the pressure sensor having a high-pressure detection accuracy of the touch and the touch input device including the pressure sensor.

17 Claims, 32 Drawing Sheets

(51) Int. Cl.
*G06F 3/041* (2006.01)
*G01L 1/14* (2006.01)
*G01L 9/00* (2006.01)
*H01L 27/32* (2006.01)
*F21V 8/00* (2006.01)
*G02F 1/1333* (2006.01)
*G02F 1/1335* (2006.01)

(52) U.S. Cl.
CPC .......... *G06F 3/0418* (2013.01); *G06F 3/0446* (2019.05); *H01L 27/323* (2013.01); *G02B 6/0051* (2013.01); *G02B 6/0055* (2013.01); *G02F 1/13338* (2013.01); *G02F 1/133528* (2013.01); *G06F 3/0412* (2013.01); *G06F 3/0416* (2013.01); *G06F 3/04144* (2019.05); *G06F 3/04164* (2019.05); *G06F 2203/04104* (2013.01); *G06F 2203/04105* (2013.01); *G06F 2203/04107* (2013.01)

(56) References Cited

U.S. PATENT DOCUMENTS

| | | | |
|---|---|---|---|
| 2010/0024573 A1* | 2/2010 | Daverman | G01L 1/142 73/862.626 |
| 2011/0057899 A1* | 3/2011 | Sleeman | G01L 1/146 345/174 |
| 2012/0068965 A1* | 3/2012 | Wada | G06F 3/0414 345/174 |
| 2012/0075238 A1* | 3/2012 | Minami | G06F 3/044 345/174 |
| 2014/0292699 A1 | 10/2014 | Ando | |
| 2015/0268766 A1* | 9/2015 | Kim | G06F 3/044 345/174 |
| 2015/0268783 A1* | 9/2015 | Yoon | G06F 3/0414 345/173 |
| 2016/0034087 A1 | 2/2016 | Kim et al. | |
| 2018/0260051 A1* | 9/2018 | Kim | G06F 3/044 |
| 2019/0114004 A1* | 4/2019 | Lee | G06F 3/0418 |

FOREIGN PATENT DOCUMENTS

| | | | |
|---|---|---|---|
| JP | 2017027565 A | | 4/2016 |
| KR | 1020130060716 A | * | 6/2013 |
| KR | 1020130060716 | | 10/2013 |
| WO | 2013/089048 | | 6/2013 |

* cited by examiner

[Fig 1]
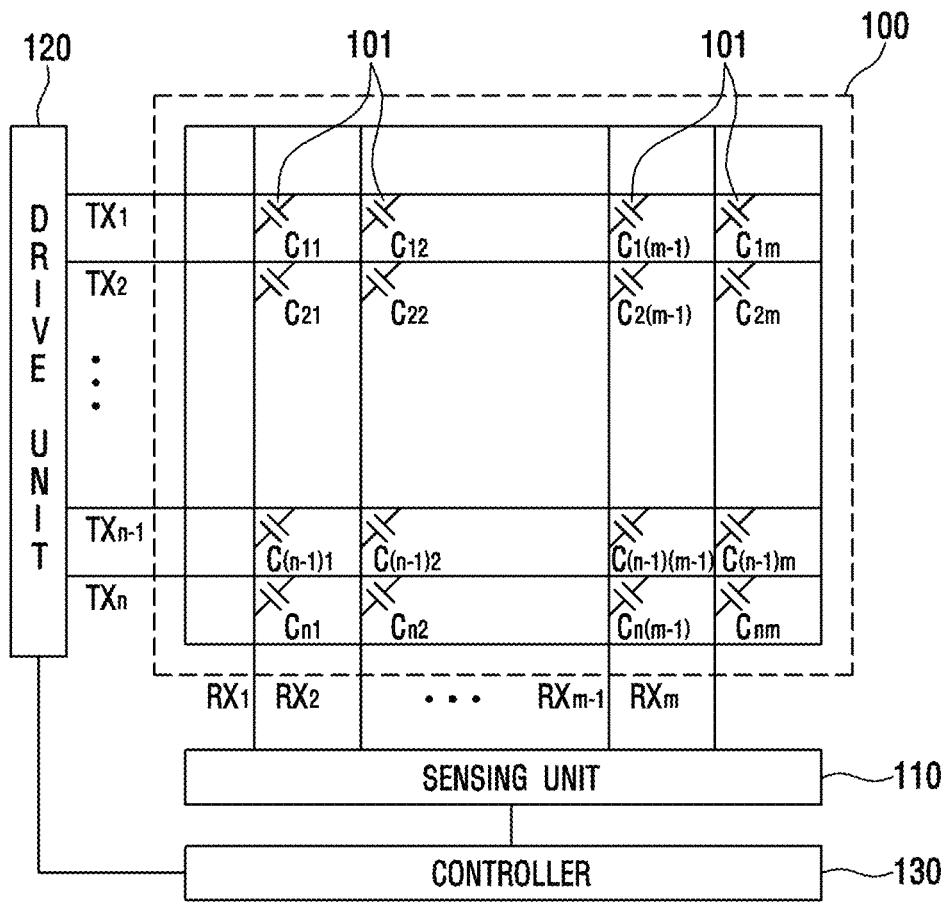
[Fig 2a]
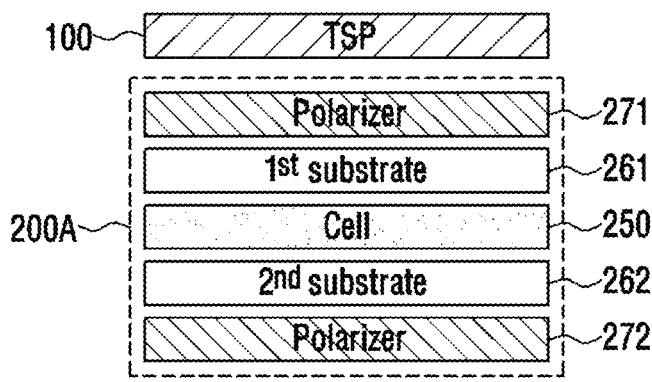

[Fig. 2b]
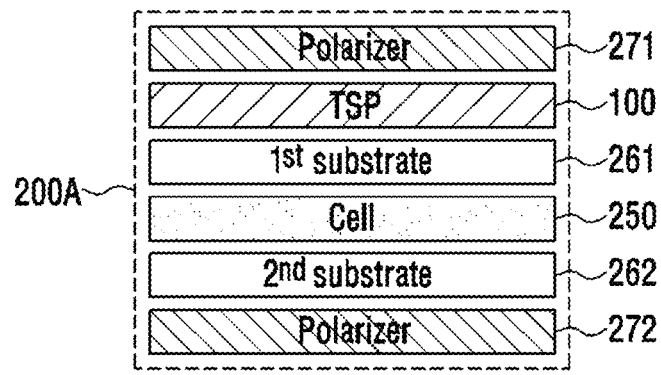
[Fig. 2c]
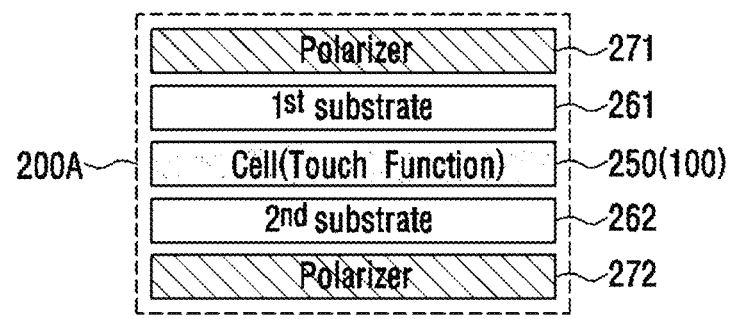
[Fig. 2d]
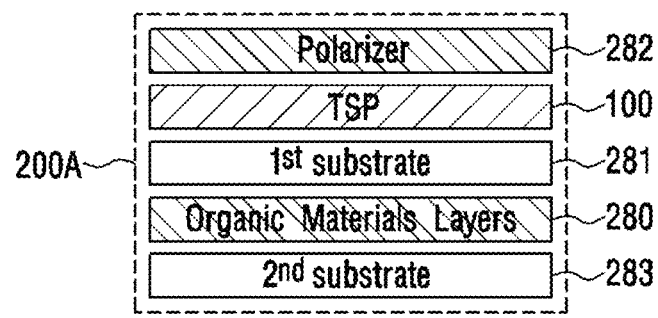

[Fig 2e]
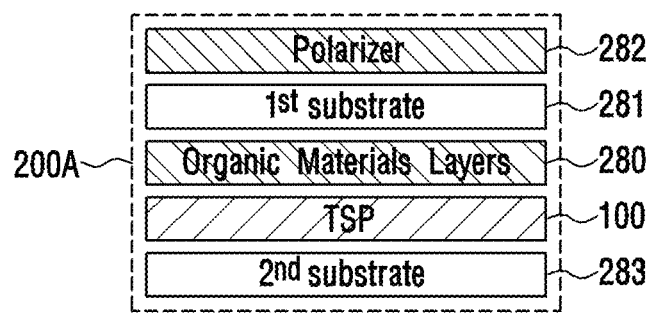
[Fig 3a]
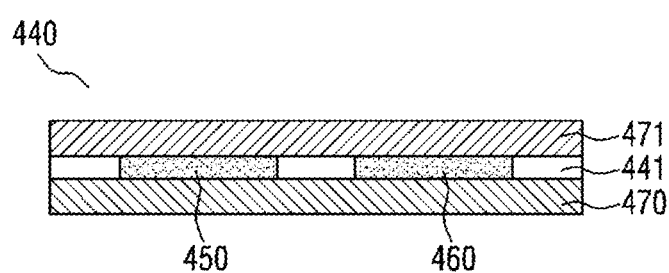

[Fig 3b]
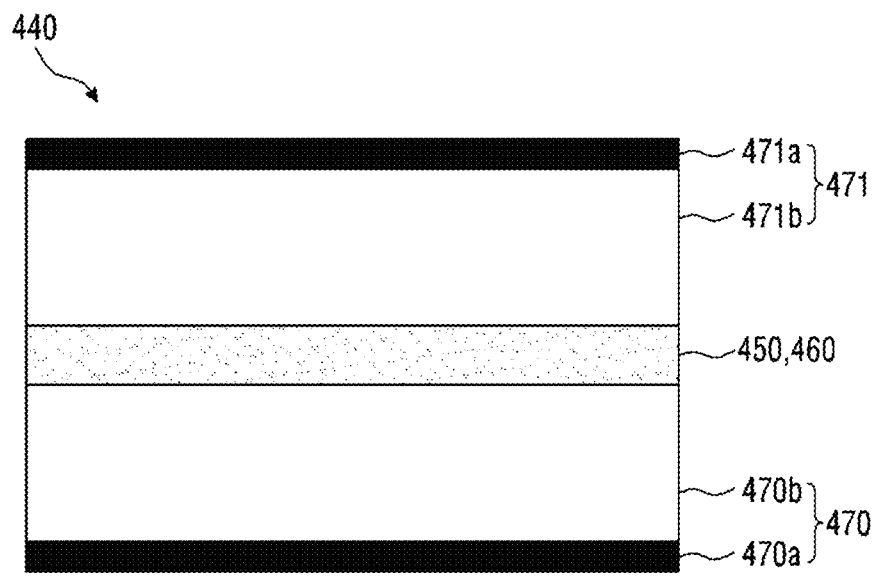
[Fig 3c]

[Fig 3d]
[Fig 3e]
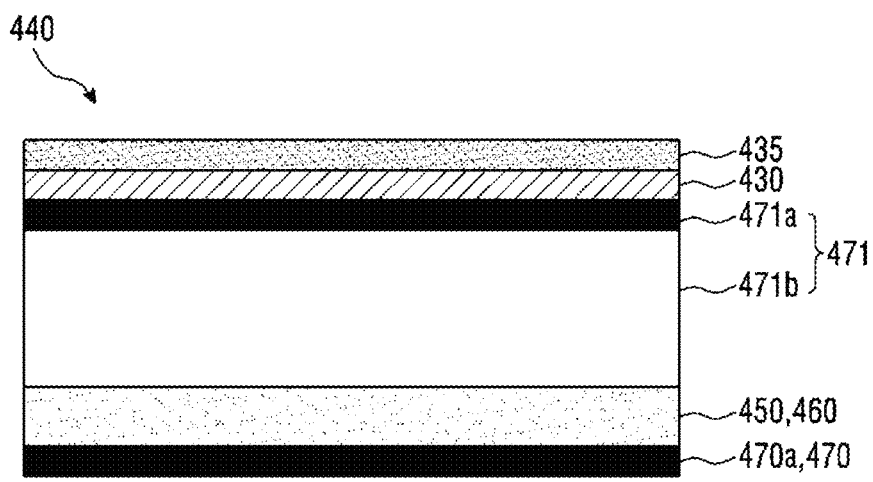

[Fig 3f]
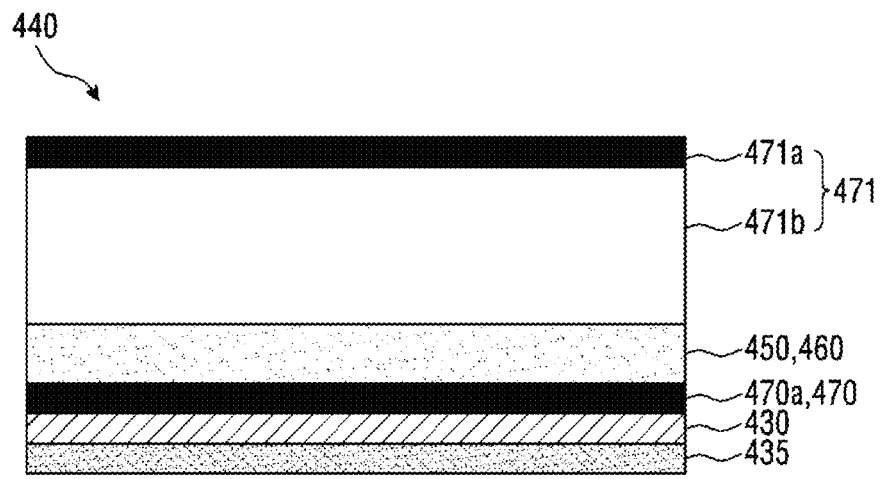
[Fig 3g]
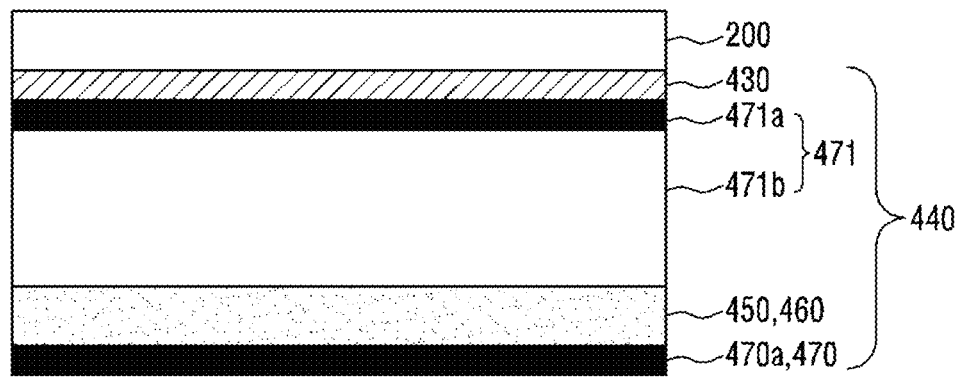
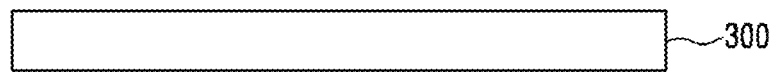

[Fig 3h]
[Fig 3i]
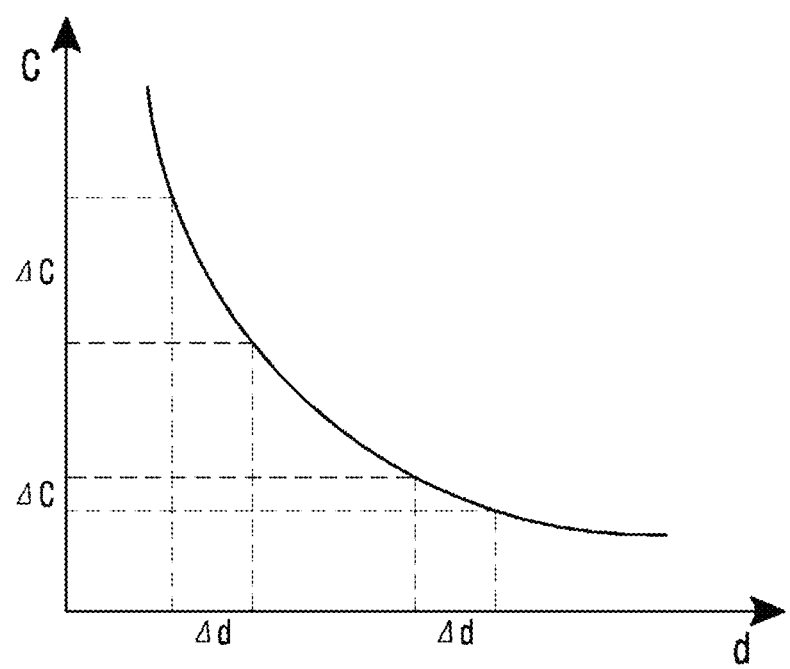

【Fig 4a】
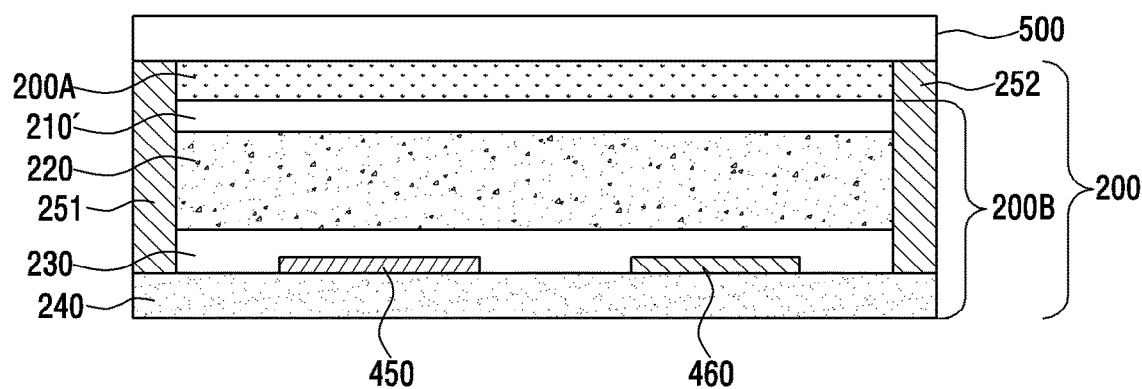
【Fig 4b】
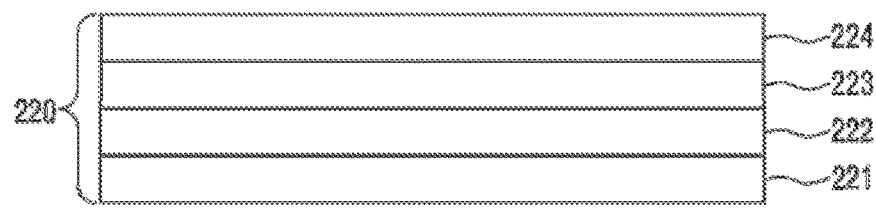

[Fig 4c]
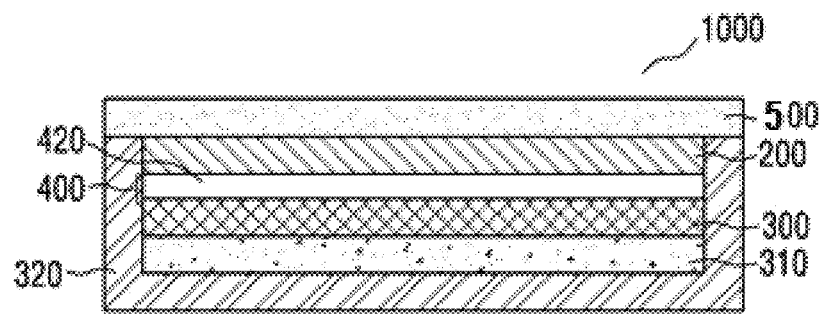
[Fig 5a]
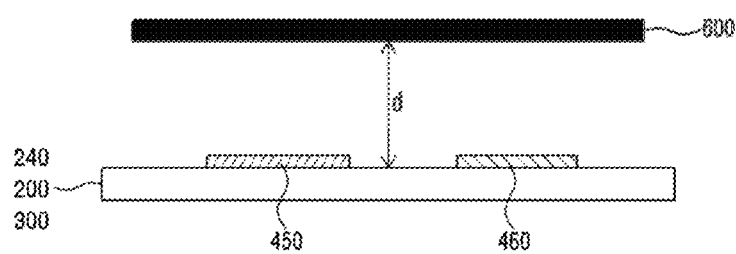
[Fig 5b]
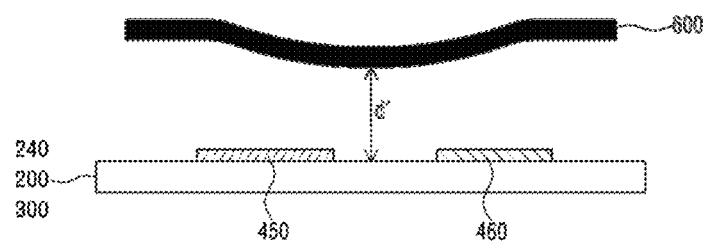

[Fig 5c]
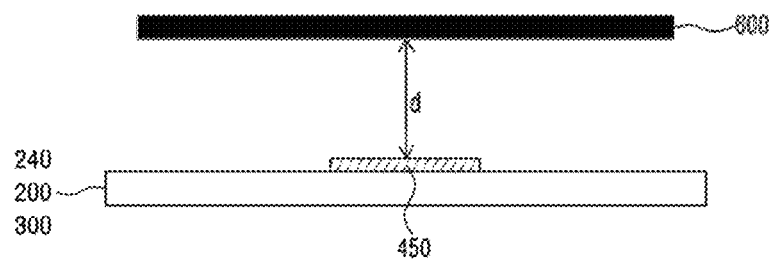
[Fig 5d]
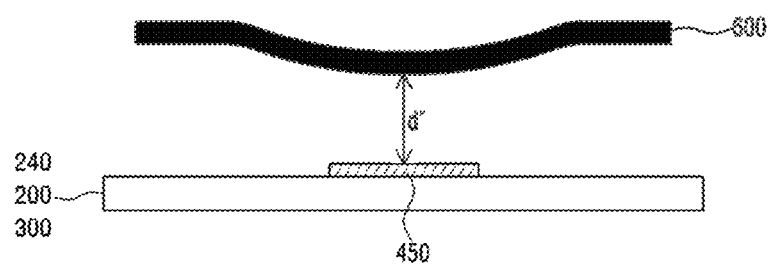
[Fig 5e]
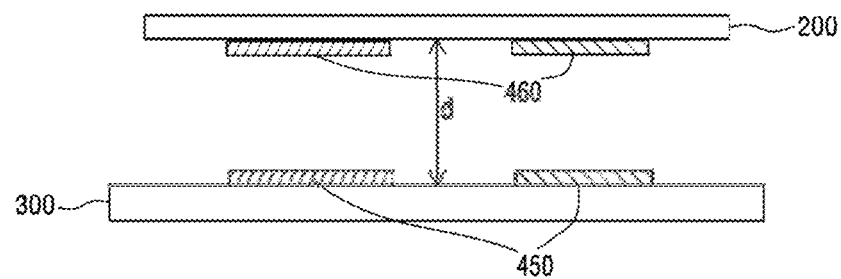

[Fig 6a]
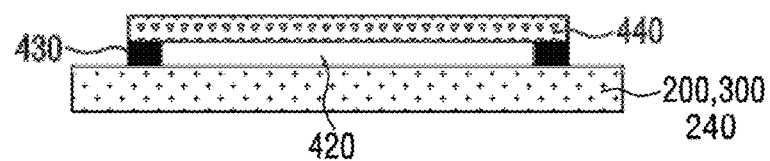
[Fig 6b]
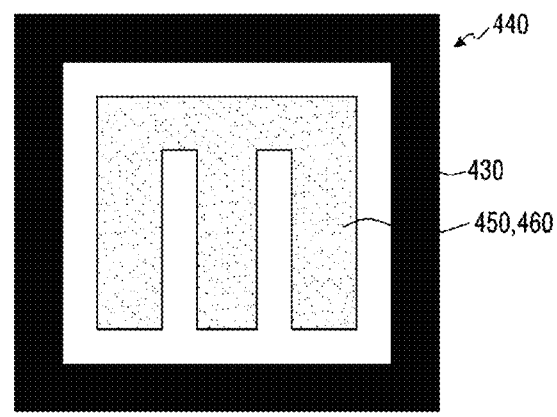
[Fig 6c]
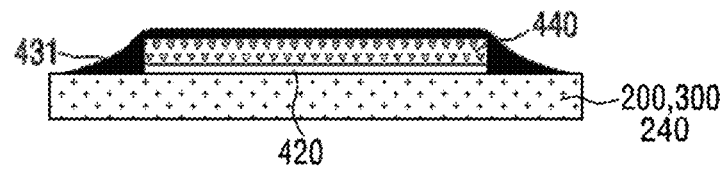

[Fig 7a]
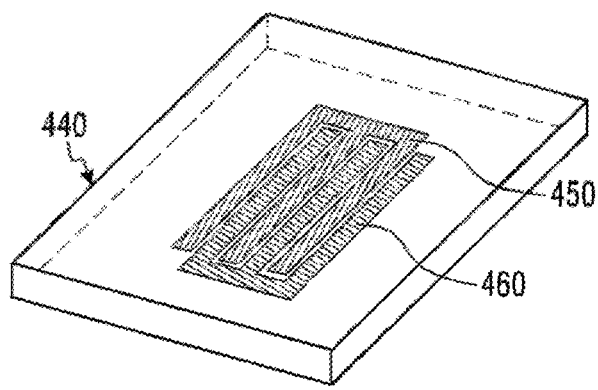
[Fig 7b]
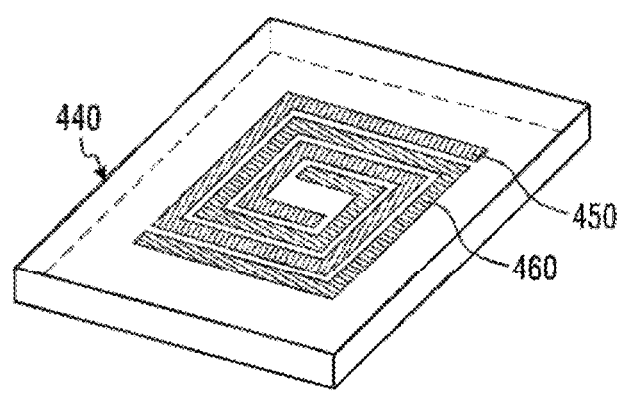

[Fig 7c]
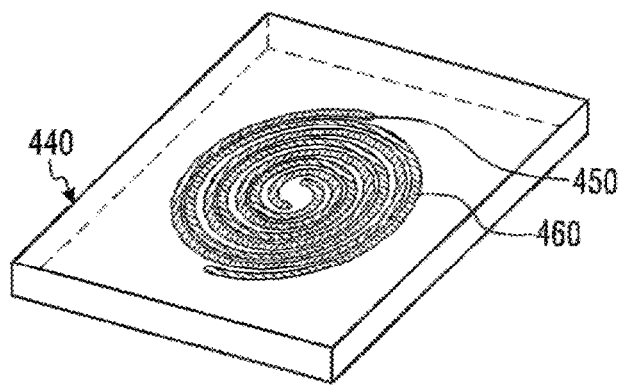
[Fig 7d]
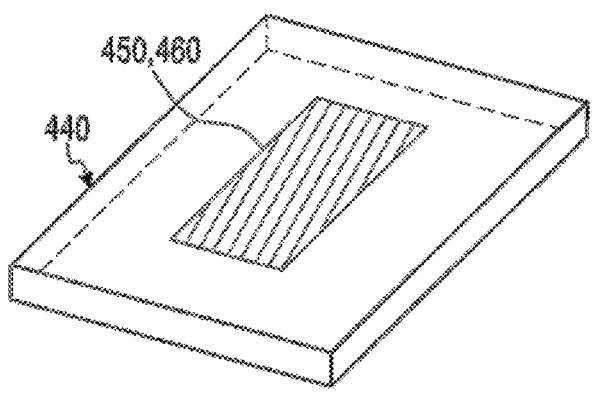

[Fig 7e]
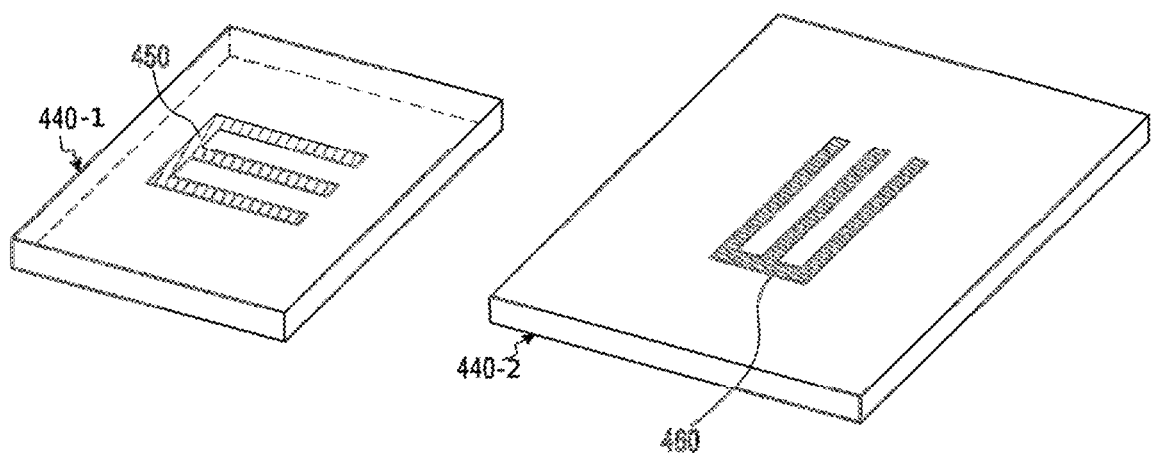
[Fig 8a]
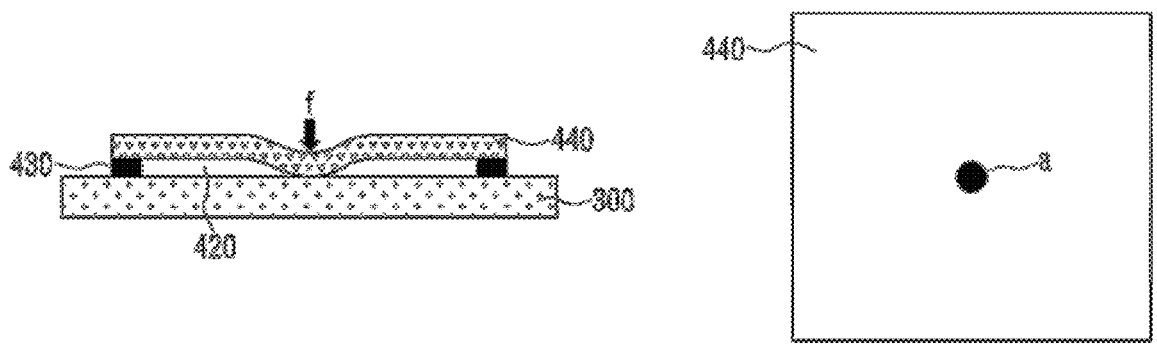

[Fig 8b]
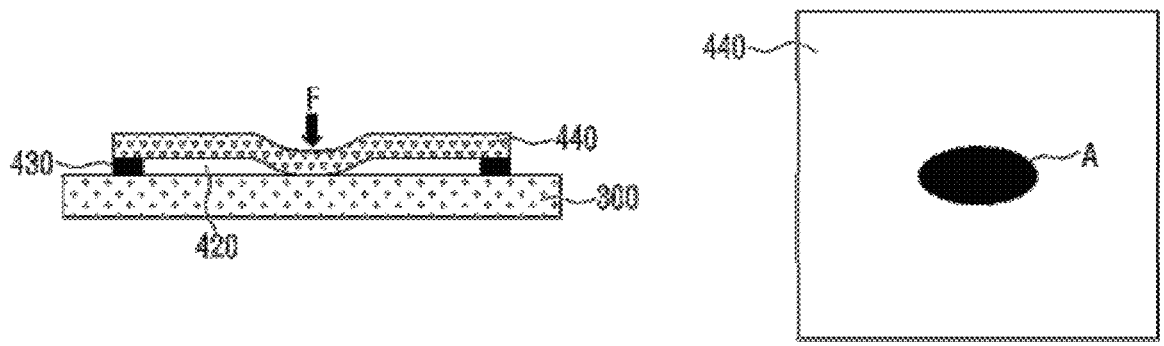
[Fig 9]
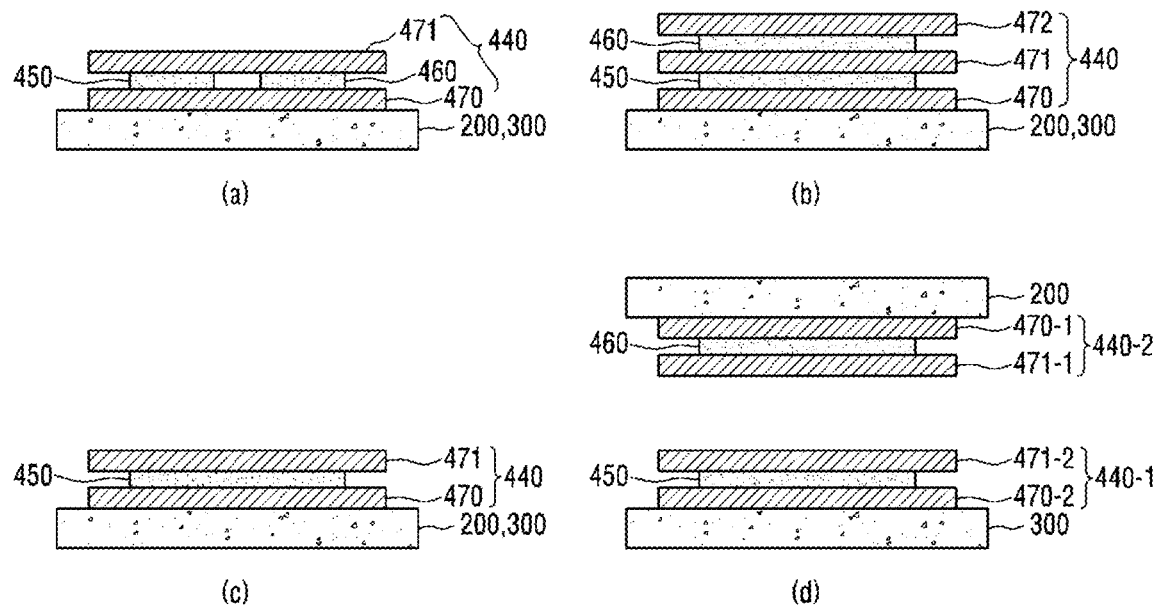

[Fig 10a]
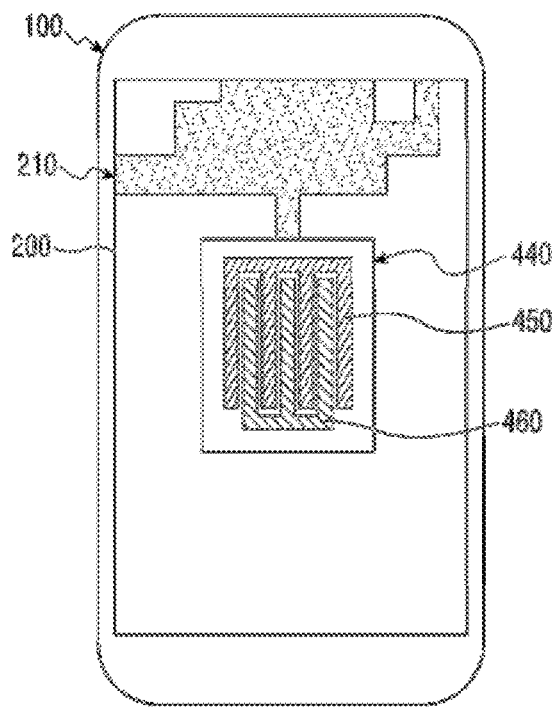
[Fig 10b]
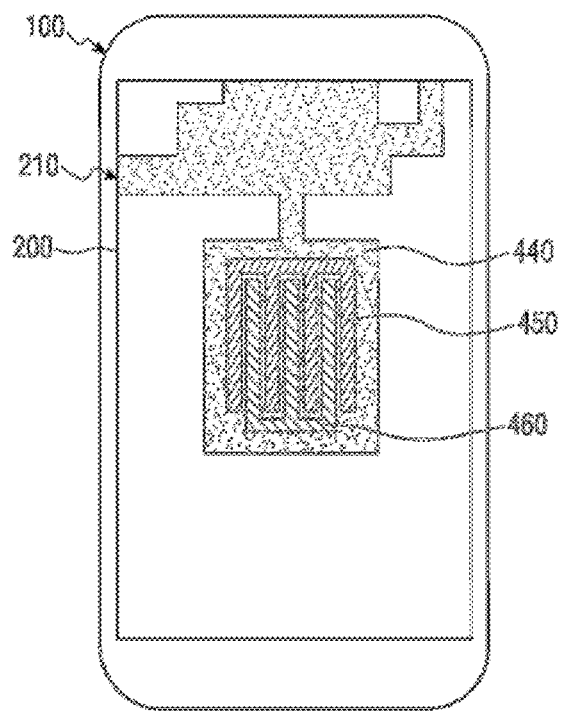

[Fig 11a]
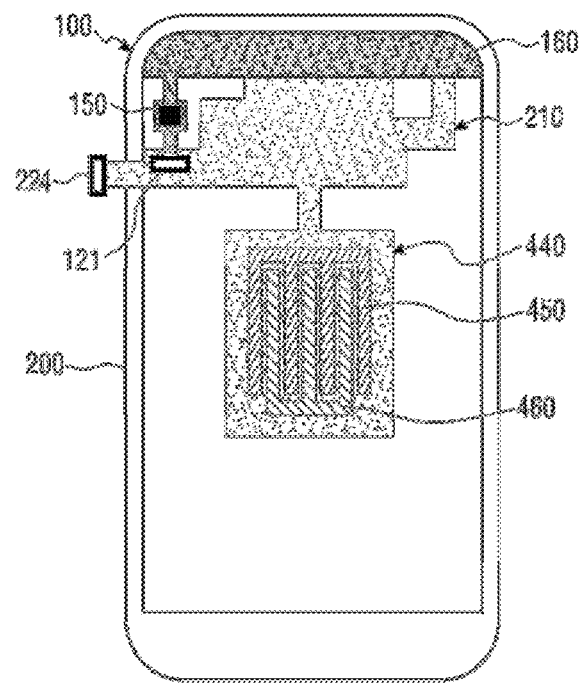
[Fig 11b]
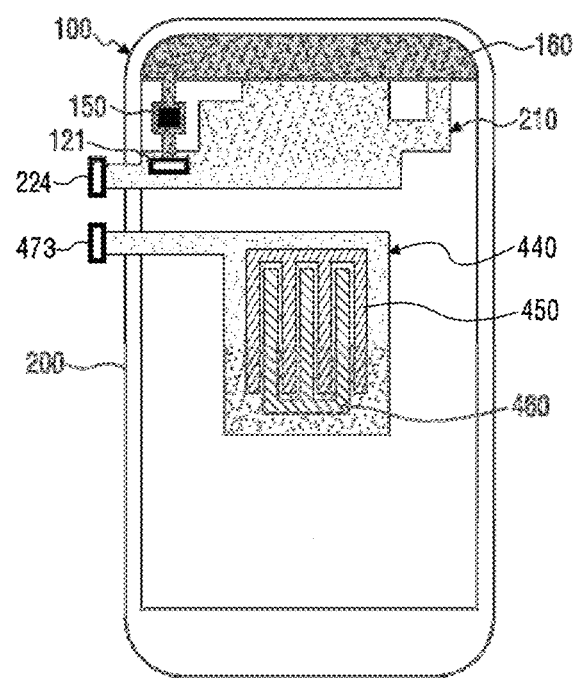

[Fig 11c]
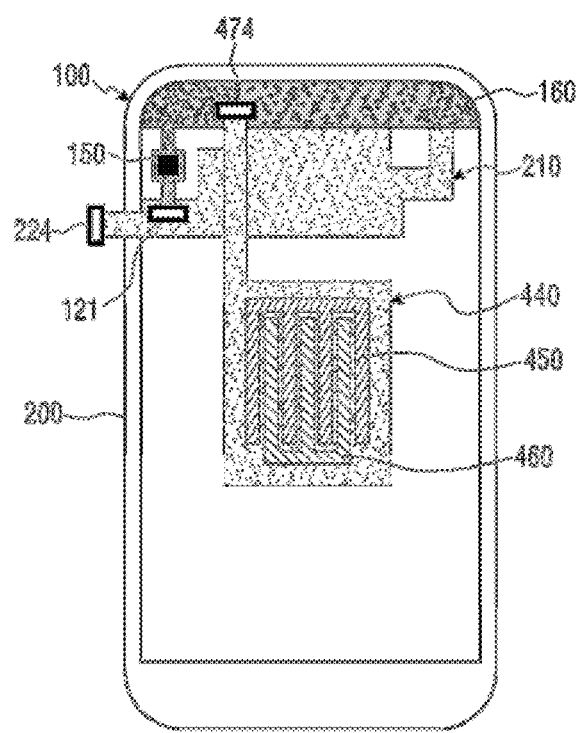

[Fig 12a]
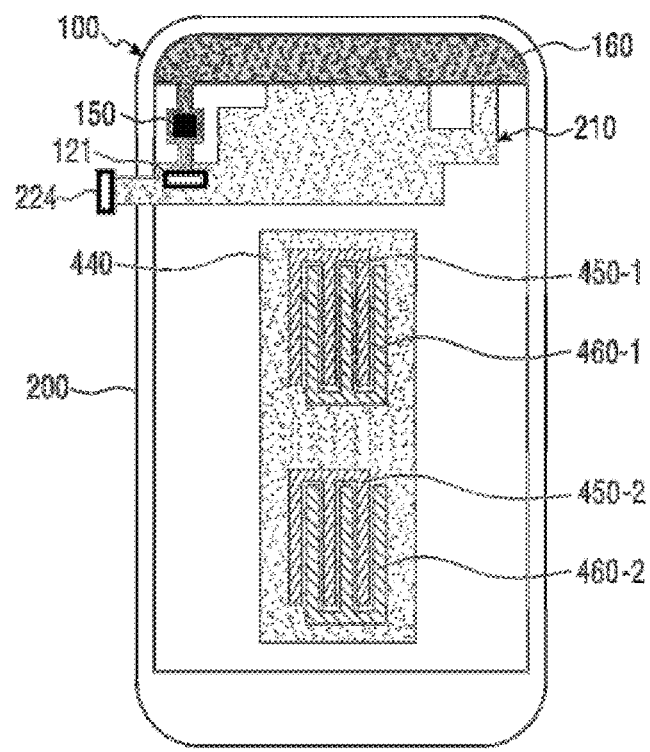
[Fig 12b]
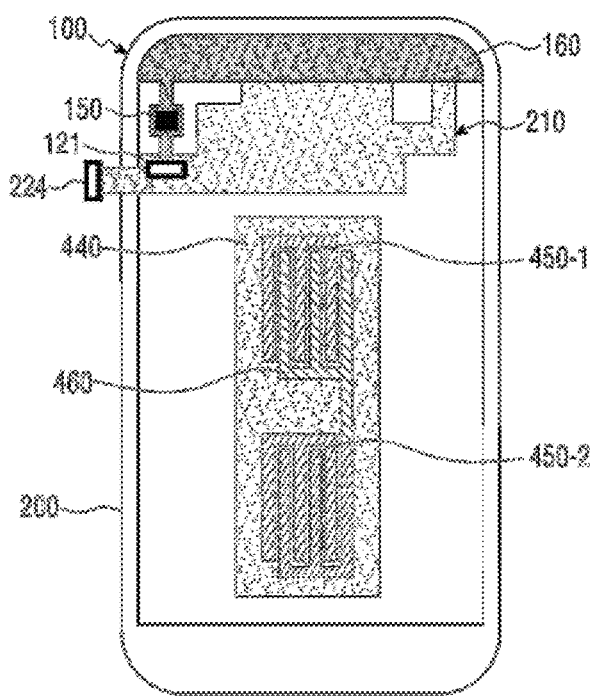

[Fig 12c]
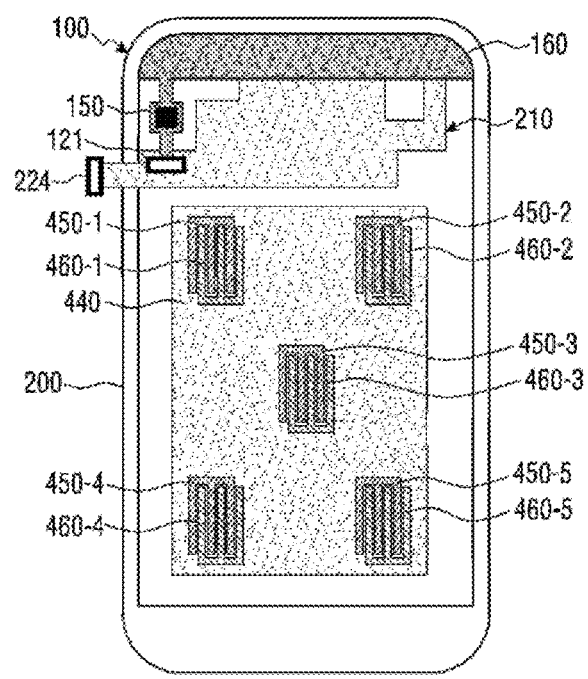

[Fig 12d]
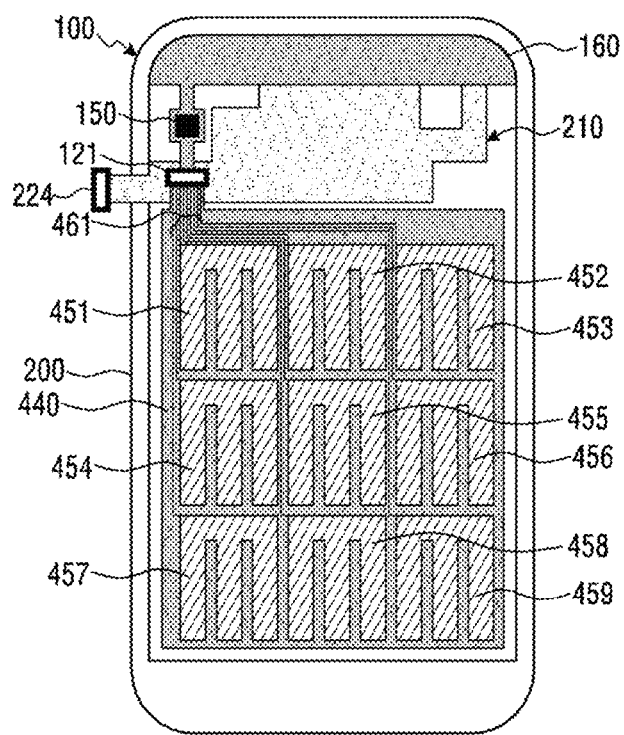
[Fig 13a]
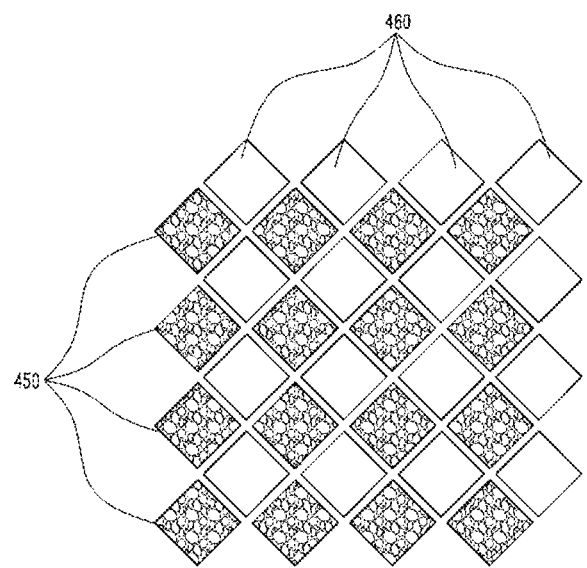

[Fig 13b]
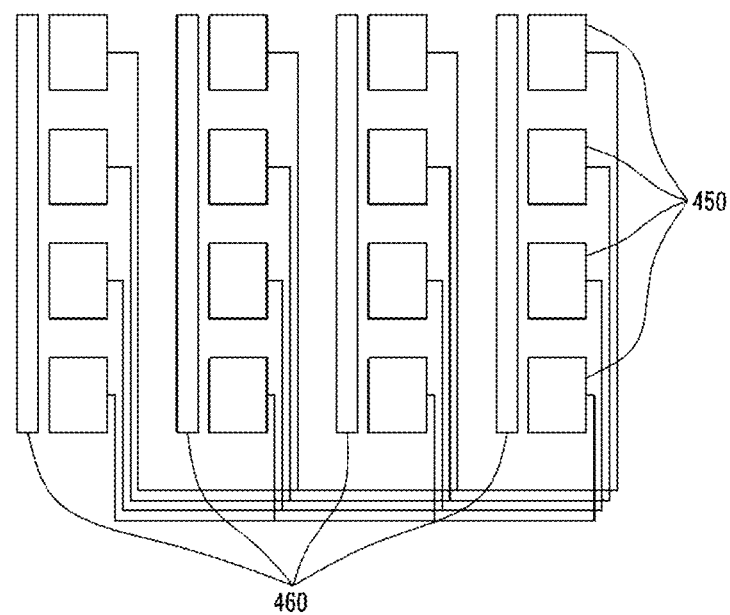
[Fig 13c]
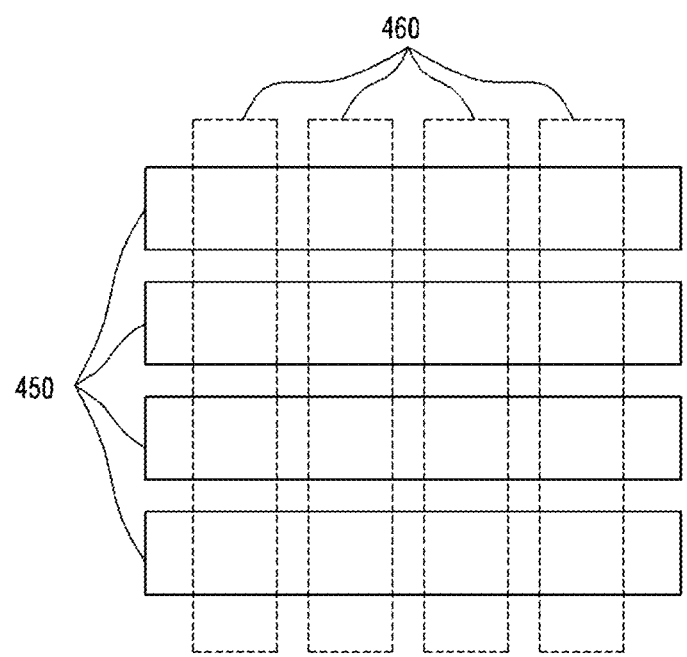

[Fig 13d]
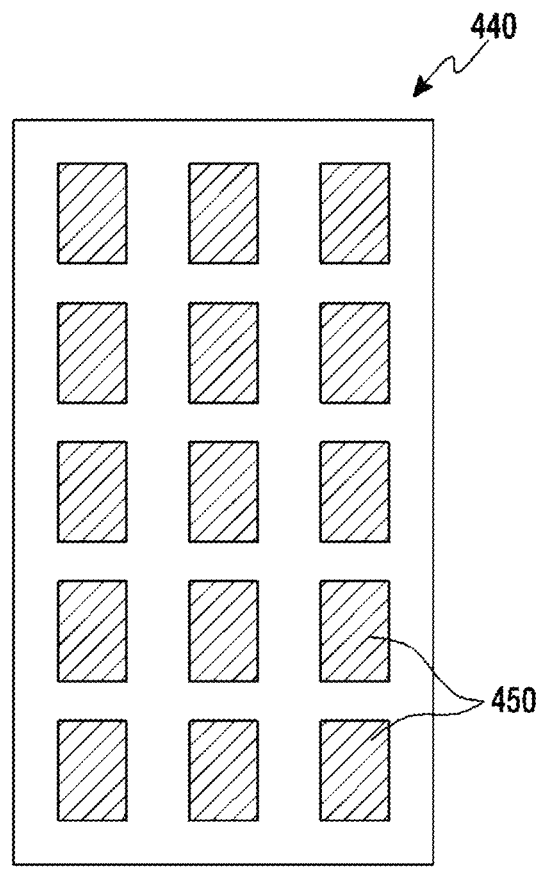

[Fig 14a]
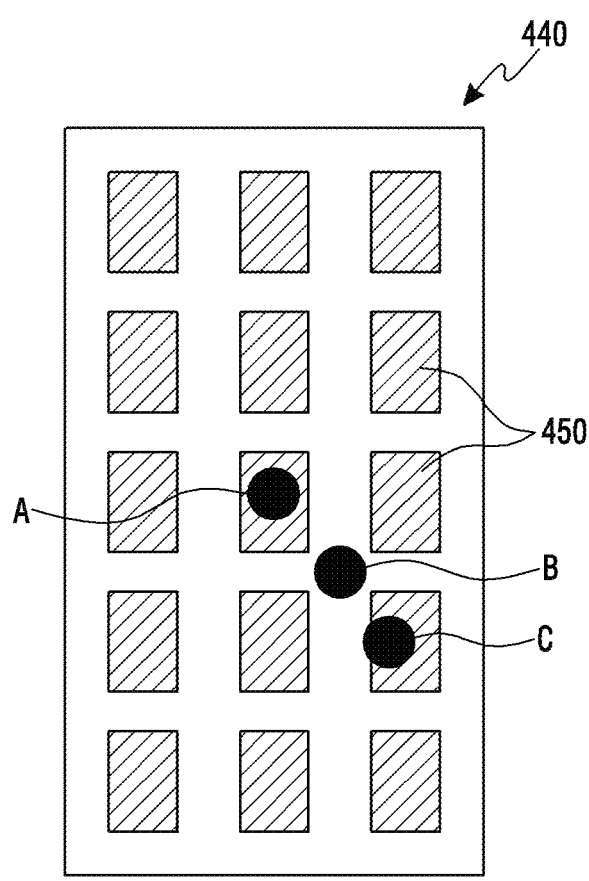

[Fig 14b]
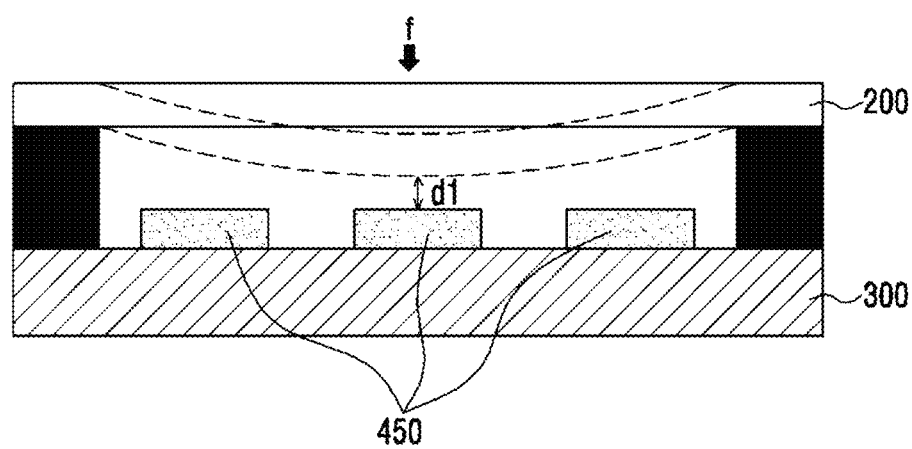
[Fig 14c]
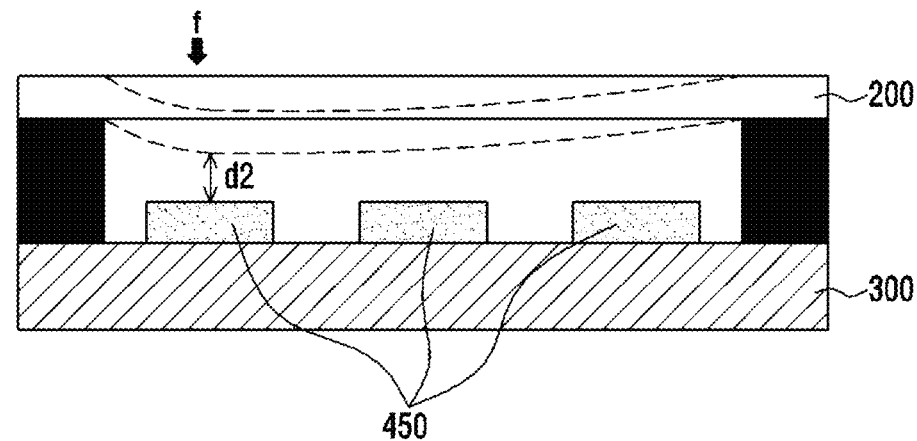

[Fig 15]
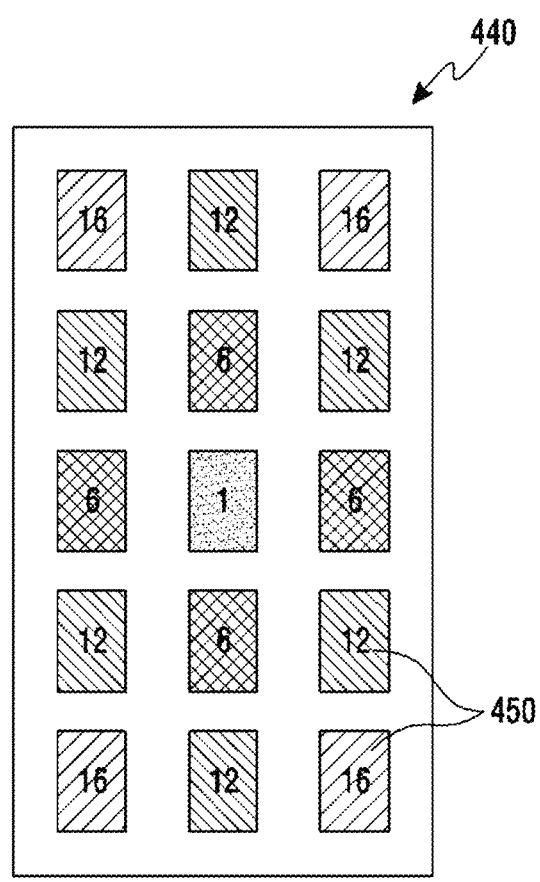

[Fig 16a]
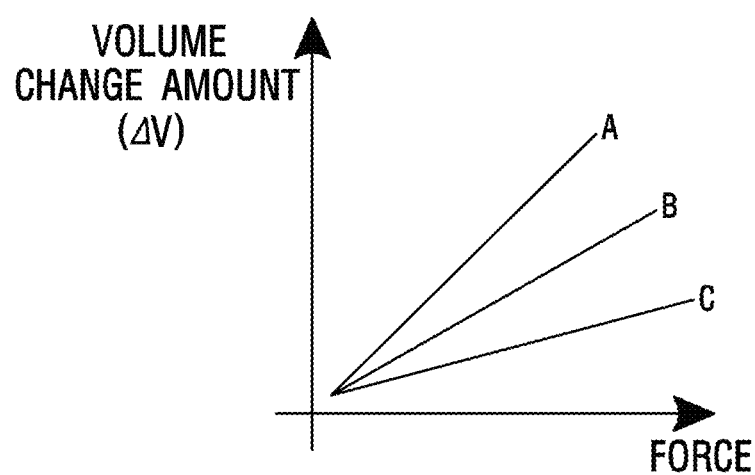
[Fig 16b]
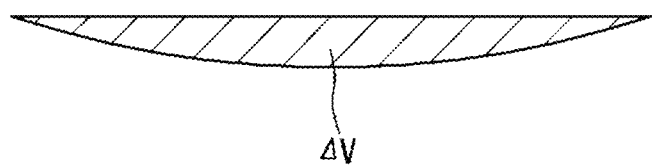
[Fig 16c]
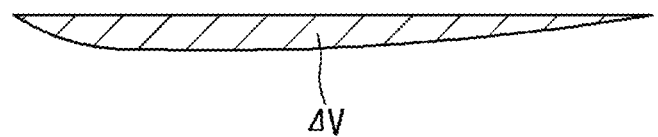

[Fig 17a]
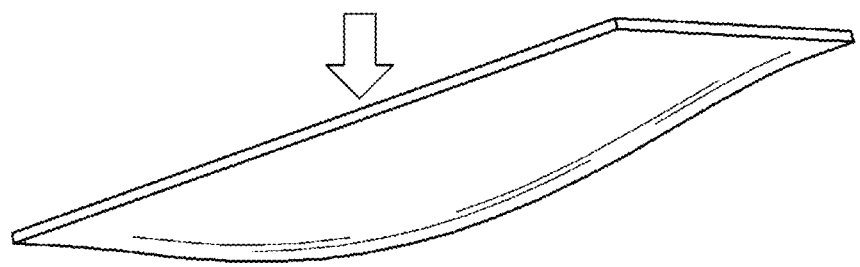
[Fig 17b]
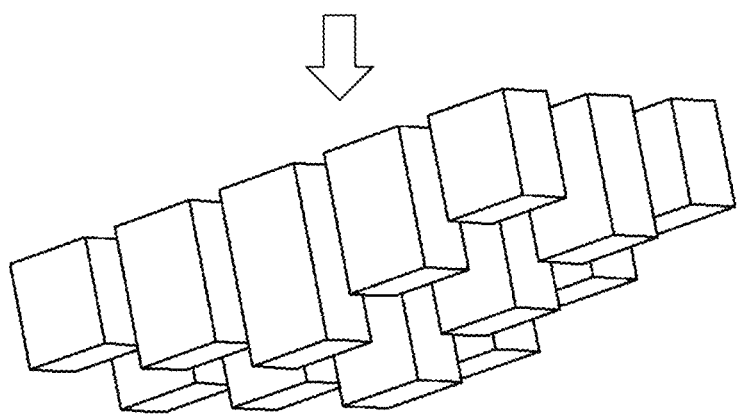

[Fig 17c]
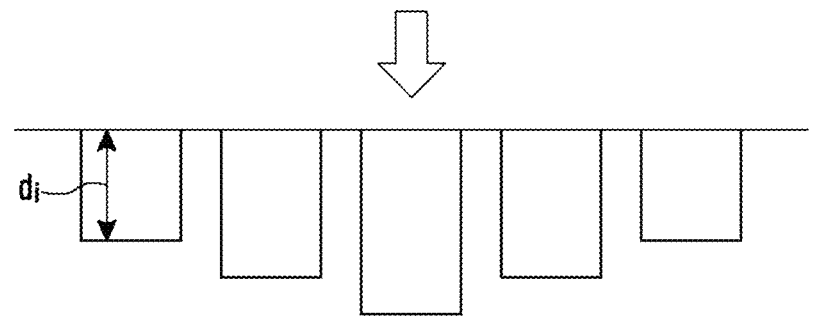
[Fig 18a]
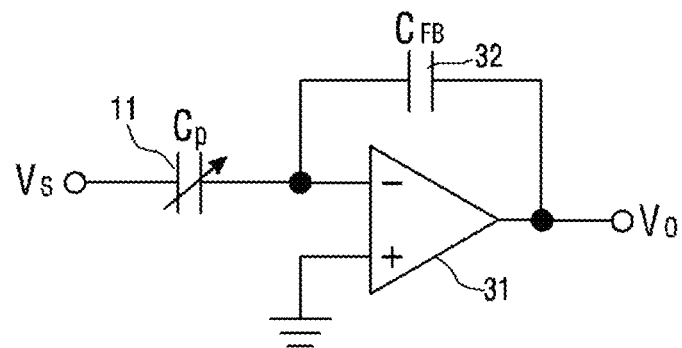
[Fig 18b]
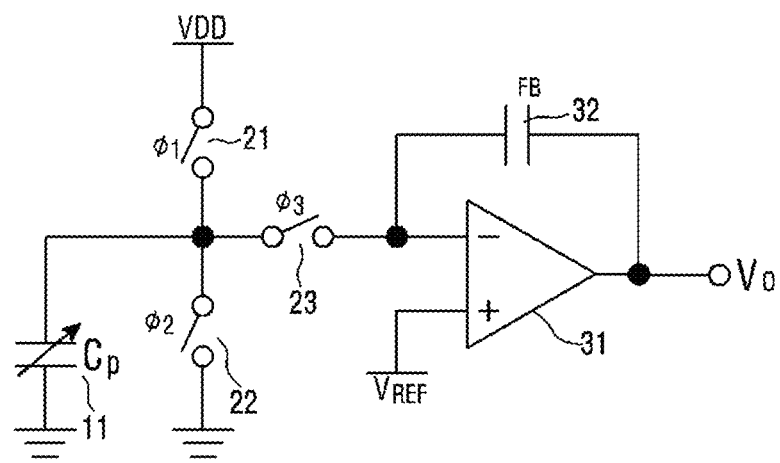

[Fig 19a]
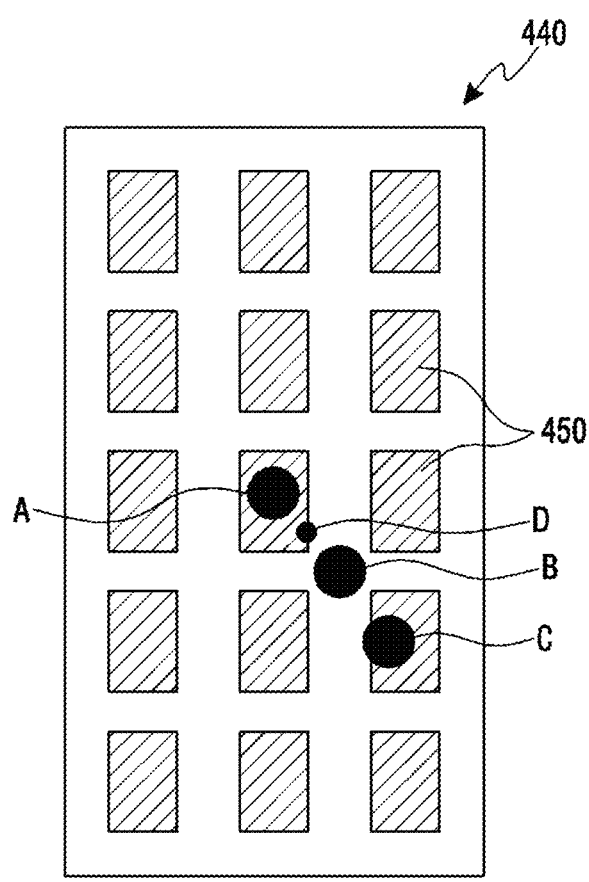

[Fig 19b]
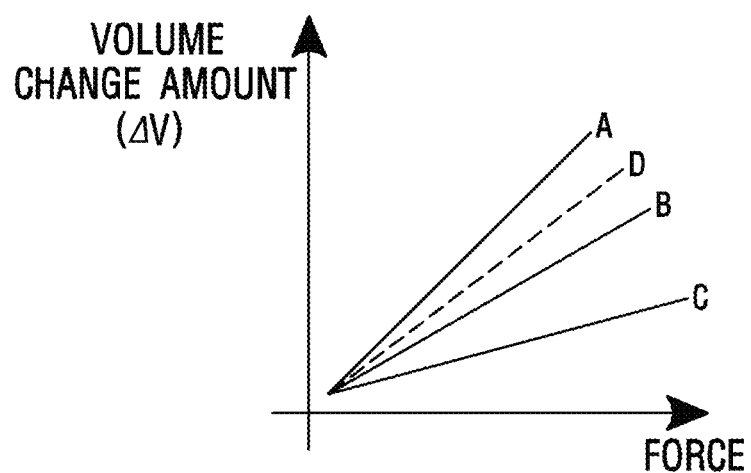
[Fig 20a]
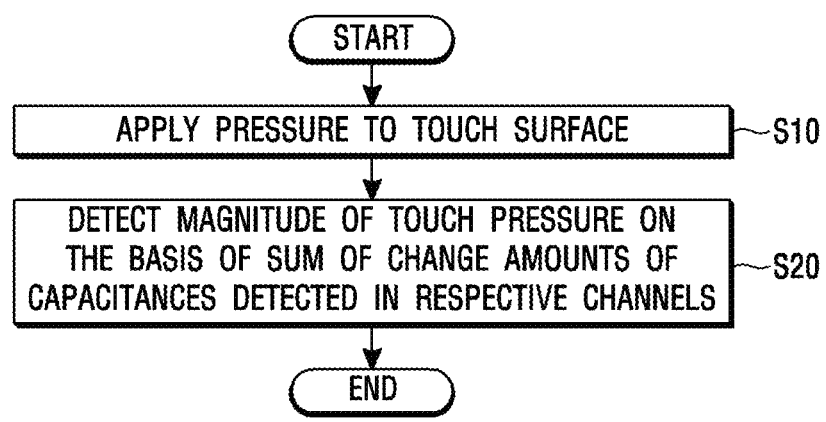

[Fig 20b]
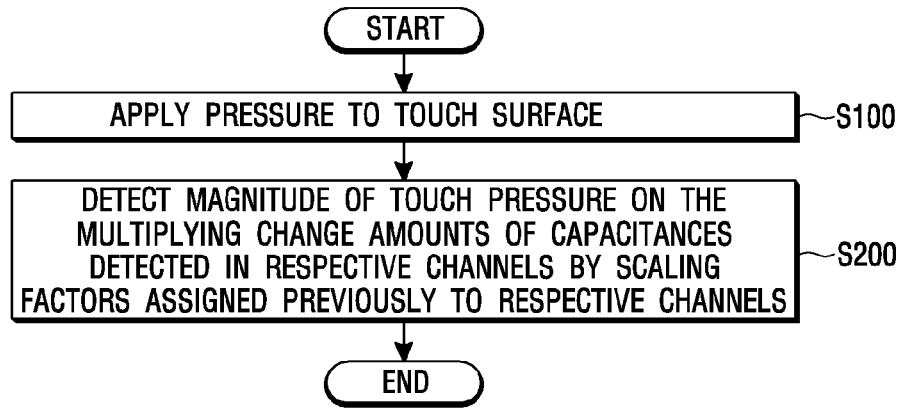
[Fig 20c]
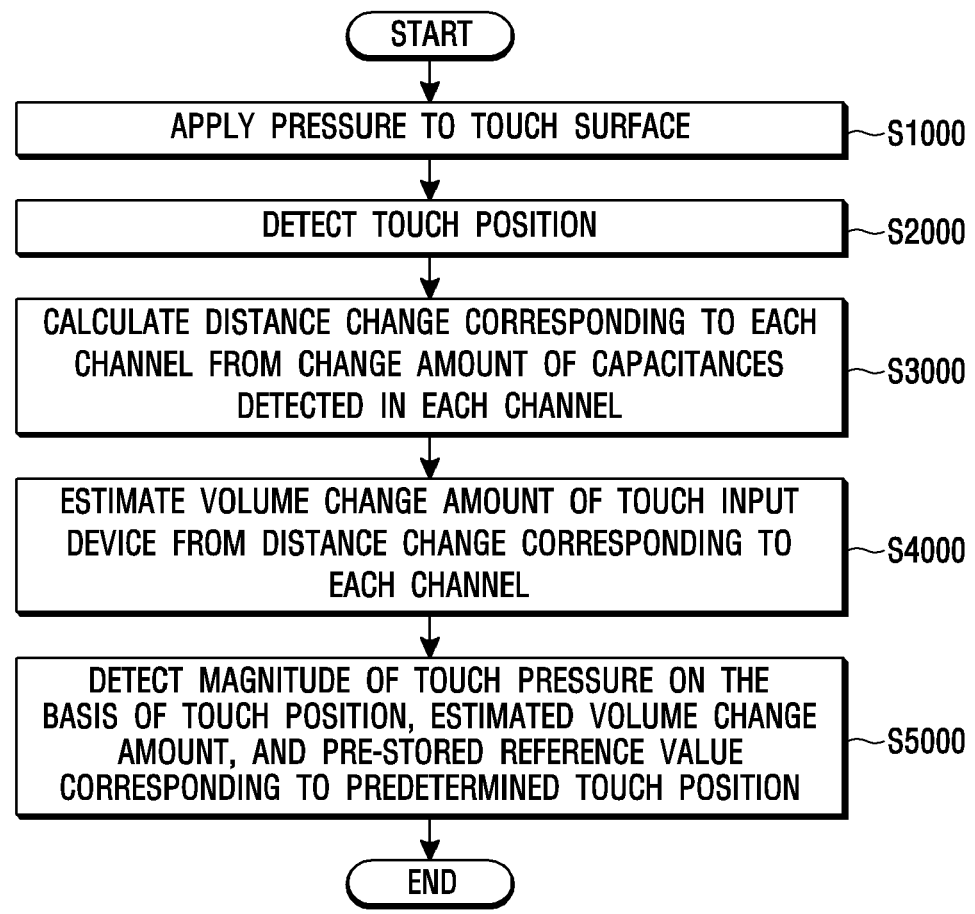

PRESSURE SENSOR, TOUCH INPUT DEVICE INCLUDING SAME, AND PRESSURE DETECTION METHOD USING SAME

CROSS-REFERENCE TO RELATED PATENT APPLICATIONS

The present application is a U.S. national stage application under 35 U.S.C. § 371 of PCT Application No. PCT/IB2016/051916, filed Apr. 5, 2016, the disclosure of which is incorporated by reference in its entirety.

TECHNICAL FIELD

The present disclosure relates to a pressure sensor for pressure detection and a touch input device including the same, and more particularly to a pressure sensor which is applied to a touch input device configured to detect a touch position and is capable of detecting a touch pressure, the touch input device including the same, and a pressure detection method using the same.

BACKGROUND ART

Various kinds of input devices are being used to operate a computing system. For example, the input device includes a button, key, joystick and touch screen. Since the touch screen is easy and simple to operate, the touch screen is increasingly being used to operate the computing system.

The touch screen may constitute a touch surface of a touch input device including a touch sensor panel which may be a transparent panel including a touch-sensitive surface. The touch sensor panel is attached to the front side of a display screen, and then the touch-sensitive surface may cover the visible side of the display screen. The touch screen allows a user to operate the computing system by simply touching the touch screen by a finger, etc. Generally, the computing system recognizes the touch and a position of the touch on the touch screen and analyzes the touch, and thus, performs operations in accordance with the analysis.

Here, there is a demand for a touch input device capable of detecting not only the touch position according to the touch on the touch screen but a pressure magnitude of the touch.

DISCLOSURE

Technical Problem

The object of the present invention is to provide a pressure sensor for pressure detection, a touch input device including the same, and a pressure detection method using the same.

Technical Solution

One embodiment is a touch input device capable of detecting a pressure of a touch on a touch surface. The touch input device includes: a display module; and a pressure sensor which is disposed at a position where a distance between the pressure sensor and a reference potential layer is changeable according to the touch on the touch surface. The distance is changeable according to a pressure magnitude of the touch. The pressure sensor outputs a signal including information on a capacitance which is changed according to the distance. The pressure sensor includes a plurality of electrodes to form a plurality of channels. The pressure magnitude of the touch is detected on the basis of a change amount of the capacitance detected in each of the channels. According to the embodiment of the present invention, it is possible to provide a pressure sensor for pressure detection, a touch input device including the same, and a pressure detection method using the same. In addition, according to the embodiment of the present invention, it is possible to provide the pressure sensor having a high-pressure detection accuracy of the touch and the touch input device including the pressure sensor.

Another embodiment is a pressure sensor including a first insulation layer and a second insulation layer and a first electrode and a second electrode which are located between the first insulation layer and the second insulation layer. A capacitance between the first electrode and the second electrode, which is changed according to a relative distance change between the pressure sensor and a reference potential layer spaced apart the pressure sensor is detected. The pressure sensor is configured such that a magnitude of a pressure which causes the distance change through the capacitance is detected. The pressure sensor is configured to include a plurality of the first electrodes and a plurality of the second electrodes and to form a plurality of channels. The pressure sensor is used to detect the pressure magnitude of a touch on the basis of a change amount of the capacitance detected in each of the channels.

Further another embodiment is a pressure sensor including a first insulation layer and a second insulation layer and an electrode located between the first insulation layer and the second insulation layer. A capacitance between the electrode and a reference potential layer, which is changed according to a relative distance change between the pressure sensor and the reference potential layer spaced apart the pressure sensor is detected. The pressure sensor is configured such that a magnitude of a pressure which causes the distance change through the capacitance is detected. The pressure sensor is configured to include a plurality of the electrodes and to form a plurality of channels. The pressure sensor is used to detect the pressure magnitude of a touch on the basis of a change amount of the capacitance detected in each of the channels.

Advantageous Effects

According to the embodiment of the present invention, it is possible to provide a pressure sensor for pressure detection, a touch input device including the same, and a pressure detection method using the same.

In addition, according to the embodiment of the present invention, it is possible to provide the pressure sensor having a high-pressure detection accuracy of the touch and the touch input device including the pressure sensor.

DESCRIPTION OF DRAWINGS

FIG. 1 is a schematic view of a configuration of a capacitance type touch sensor panel and the operation thereof;

FIGS. 2a to 2e are conceptual views showing a relative position of the touch sensor panel with respect to a display panel in a touch input device according to the embodiment;

FIGS. 3a to 3h are cross sectional views of an exemplary pressure sensor including a pressure electrode according to the embodiment of the present invention;

FIG. 3i is a view showing a capacitance change amount according to a distance change between an electrode layer and a reference potential layer according to the embodiment of the present invention;

FIG. 4a is a cross sectional view of the touch input device of a first example, to which the pressure sensor and pressure detection module according to the embodiment of the present invention can be applied;

FIG. 4b shows an optical layer of a backlight unit in the touch input device according to the embodiment;

FIG. 4c is a cross sectional view of the touch input device of a second example, to which the pressure sensor and pressure detection module according to the embodiment of the present invention can be applied;

FIG. 5a shows a relative distance between the reference potential layer and the pressure sensor of the first example, which are included in the touch input device before a pressure is applied to the touch input device, and FIG. 5b show a relative distance between the reference potential layer and the pressure sensor of the first example, which are included in the touch input device after a pressure is applied to the touch input device;

FIG. 5c shows a relative distance between the reference potential layer and the pressure sensor of the second example, which are included in the touch input device before a pressure is applied to the touch input device, and FIG. 5d show a relative distance between the reference potential layer and the pressure sensor of the second example, which are included in the touch input device after a pressure is applied to the touch input device;

FIG. 5e shows the arrangement of pressure sensors of a third example, which is included in the touch input device;

FIG. 6a is a cross sectional view showing a portion of the touch input device to which the pressure sensor has been attached according to a first method;

FIG. 6b is a plan view of the pressure sensor to be attached to the touch input device in accordance with the first method;

FIG. 6c is a cross sectional view showing a portion of the touch input device to which the pressure sensor has been attached according to a second method;

FIGS. 7a to 7e show pressure electrode patterns included in the pressure sensor for pressure detection according to the embodiment of the present invention;

FIGS. 8a and 8b show a relation between a magnitude of a touch pressure and a saturated area in the touch input device to which the pressure sensor has been applied according to the embodiment of the present invention;

Cross sections of the pressure sensor according to the embodiment of the present invention are shown in (a) to (d) of FIG. 9;

FIGS. 10a and 10b show an attachment method of the pressure sensor according the embodiment of the present invention;

FIGS. 11a to 11c show how the pressure sensor is connected to a touch sensing circuit in accordance with the embodiment of the present invention;

FIGS. 12a to 12d show that the pressure sensor according to the embodiment of the present invention includes a plurality of channels;

FIGS. 13a to 13c show forms of a first electrode and a second electrode included in the pressure sensor according to the embodiment of the present invention;

FIG. 13d shows the form of the first electrode included in the pressure sensor according to the embodiment of the present invention;

FIG. 14a is a view showing that a pressure is applied to a predetermined position in the pressure sensor shown in FIG. 13d;

FIG. 14b is a cross sectional view showing a form in which the touch input device is bent when the touch pressure is applied to a touch surface corresponding to a position "A" of FIG. 14a;

FIG. 14c is a cross sectional view showing a form in which the touch input device is bent when the touch pressure is applied to a touch surface corresponding to a position "C" of FIG. 14a;

FIG. 15 is a view showing a scaling factor assigned to each first electrode in the pressure sensor shown in FIG. 13d;

FIG. 16a is a graph for describing, when the pressure is applied to the position shown in FIG. 14a, a relation between a volume change amount of the touch input device and a magnitude of the applied pressure;

FIG. 16b is a cross sectional view showing the volume change amount of the touch input device shown in FIG. 14b;

FIG. 16c is a cross sectional view showing the volume change amount of the touch input device shown in FIG. 14c;

FIG. 17a is a partial perspective view for describing a form in which the touch input device is deformed when the pressure is applied to the touch input device;

FIG. 17b is a view for describing the estimation of the volume change amount of the touch input device when the pressure is applied to the touch input device;

FIG. 17c is a cross sectional view of FIG. 17b;

FIG. 18a shows an equivalent circuit of a device for sensing a pressure capacitance of the pressure sensor having the forms shown in FIGS. 13a to 13c;

FIG. 18b shows an equivalent circuit of a device for sensing the pressure capacitance of the pressure sensor shown in FIG. 13d;

FIG. 19a is a view for describing a case where a pressure is applied to a position of the pressure sensor shown in FIG. 14a, which corresponds to a position "D" of FIG. 19a;

FIG. 19b is a graph for describing the calculation of a pressure value when the pressure is applied to the position "D" shown in FIG. 19a; and FIGS. 20a to 20c are flowcharts for describing examples of a method for detecting the magnitude of the touch pressure by using a plurality of channels in the touch input device according to the embodiment of the present invention.

MODE FOR INVENTION

The following detailed description of the present invention shows a specified embodiment of the present invention and will be provided with reference to the accompanying drawings. The embodiment will be described in enough detail that those skilled in the art are able to embody the present invention. It should be understood that various embodiments of the present invention are different from each other and need not be mutually exclusive. Similar reference numerals in the drawings designate the same or similar functions in many aspects.

Hereinafter, a pressure sensor for pressure detection and a touch input device to which a pressure detection module including the pressure sensor according to an embodiment of the present invention can be applied will be described with reference to the accompanying drawings. Hereinafter, while a capacitance type touch sensor panel 100 is exemplified below, the touch sensor panel 100 capable of detecting a touch position in any manner may be applied.

FIG. 1 is a schematic view of a configuration of the capacitance type touch sensor panel 100 which is included in the touch input device to which a pressure sensor 440 and the pressure detection module including the pressure sensor 440 according to the embodiment of the present invention can be applied, and the operation of the touch sensor panel. Referring to FIG. 1, the touch sensor panel 100 may include a plurality of drive electrodes TX1 to TXn and a plurality of receiving electrodes RX1 to RXm, and may include a drive unit 120 which applies a driving signal to the plurality of drive electrodes TX1 to TXn for the purpose of the operation of the touch sensor panel 100, and a sensing unit 110 which detects whether or not the touch occurs and/or the touch position by receiving a sensing signal including information on the capacitance change amount changing according to the touch on the touch surface of the touch sensor panel 100.

As shown in FIG. 1, the touch sensor panel 100 may include the plurality of drive electrodes TX1 to TXn and the plurality of receiving electrodes RX1 to RXm. While FIG. 1 shows that the plurality of drive electrodes TX1 to TXn and the plurality of receiving electrodes RX1 to RXm of the touch sensor panel 100 form an orthogonal array, the present invention is not limited to this. The plurality of drive electrodes TX1 to TXn and the plurality of receiving electrodes RX1 to RXm has an array of arbitrary dimension, for example, a diagonal array, a concentric array, a 3-dimensional random array, etc., and an array obtained by the application of them. Here, "n" and "m" are positive integers and may be the same as each other or may have different values. The magnitude of the value may be changed depending on the embodiment.

As shown in FIG. 1, the plurality of drive electrodes TX1 to TXn and the plurality of receiving electrodes RX1 to RXm may be arranged to cross each other. The drive electrode TX may include the plurality of drive electrodes TX1 to TXn extending in a first axial direction. The receiving electrode RX may include the plurality of receiving electrodes RX1 to RXm extending in a second axial direction crossing the first axial direction.

In the touch sensor panel 100 according to the embodiment of the present invention, the plurality of drive electrodes TX1 to TXn and the plurality of receiving electrodes RX1 to RXm may be formed in the same layer. For example, the plurality of drive electrodes TX1 to TXn and the plurality of receiving electrodes RX1 to RXm may be formed on the same side of an insulation layer (not shown). Also, the plurality of drive electrodes TX1 to TXn and the plurality of receiving electrodes RX1 to RXm may be formed in the different layers. For example, the plurality of drive electrodes TX1 to TXn and the plurality of receiving electrodes RX1 to RXm may be formed on both sides of one insulation layer (not shown) respectively, or the plurality of drive electrodes TX1 to TXn may be formed on a side of a first insulation layer (not shown) and the plurality of receiving electrodes RX1 to RXm may be formed on a side of a second insulation layer (not shown) different from the first insulation layer.

The plurality of drive electrodes TX1 to TXn and the plurality of receiving electrodes RX1 to RXm may be made of a transparent conductive material (for example, indium tin oxide (ITO) or antimony tin oxide (ATO) which is made of tin oxide ($SnO_2$), and indium oxide ($In_2O_3$), etc.), or the like. However, this is only an example. The drive electrode TX and the receiving electrode RX may be also made of another transparent conductive material or an opaque conductive material. For instance, the drive electrode TX and the receiving electrode RX may be formed to include at least any one of silver ink, copper or carbon nanotube (CNT). Also, the drive electrode TX and the receiving electrode RX may be made of metal mesh or nano silver.

The drive unit 120 according to the embodiment of the present invention may apply a driving signal to the drive electrodes TX1 to TXn. In the embodiment of the present invention, one driving signal may be sequentially applied at a time to the first drive electrode TX1 to the n-th drive electrode TXn. The driving signal may be applied again repeatedly. This is only an example. The driving signal may be applied to the plurality of drive electrodes at the same time in accordance with the embodiment.

Through the receiving electrodes RX1 to RXm, the sensing unit 110 receives the sensing signal including information on a capacitance (Cm) 101 generated between the receiving electrodes RX1 to RXm and the drive electrodes TX1 to TXn to which the driving signal has been applied, thereby detecting whether or not the touch has occurred and where the touch has occurred. For example, the sensing signal may be a signal coupled by the capacitance (CM) 101 generated between the receiving electrode RX and the drive electrode TX to which the driving signal has been applied. As such, the process of sensing the driving signal applied from the first drive electrode TX1 to the n-th drive electrode TXn through the receiving electrodes RX1 to RXm can be referred to as a process of scanning the touch sensor panel 100.

For example, the sensing unit 110 may include a receiver (not shown) which is connected to each of the receiving electrodes RX1 to RXm through a switch. The switch becomes the on-state in a time interval during which the signal of the corresponding receiving electrode RX is sensed, thereby allowing the receiver to sense the sensing signal from the receiving electrode RX. The receiver may include an amplifier (not shown) and a feedback capacitor coupled between the negative (−) input terminal of the amplifier and the output terminal of the amplifier, i.e., coupled to a feedback path. Here, the positive (+) input terminal of the amplifier may be connected to the ground or a reference voltage. Also, the receiver may further include a reset switch which is connected in parallel with the feedback capacitor. The reset switch may reset the conversion from current to voltage that is performed by the receiver. The negative input terminal of the amplifier is connected to the corresponding receiving electrode RX and receives and integrates a current signal including information on the capacitance (CM) 101, and then converts the integrated current signal into voltage. The sensing unit 110 may further include an analog-digital converter (ADC) (not shown) which converts the integrated data by the receiver into digital data. Later, the digital data may be input to a processor (not shown) and processed to obtain information on the touch on the touch sensor panel 100. The sensing unit 110 may include the ADC and processor as well as the receiver.

A controller 130 may perform a function of controlling the operations of the drive unit 120 and the sensing unit 110. For example, the controller 130 generates and transmits a drive control signal to the drive unit 120, so that the driving signal can be applied to a predetermined drive electrode TX1 at a predetermined time. Also, the controller 130 generates and transmits the drive control signal to the sensing unit 110, so that the sensing unit 110 may receive the sensing signal from the predetermined receiving electrode RX at a predetermined time and perform a predetermined function.

In FIG. 1, the drive unit 120 and the sensing unit 110 may constitute a touch detection device (not shown) capable of detecting whether the touch has occurred on the touch sensor panel 100 according to the embodiment of the present invention or not and/or where the touch has occurred. The touch detection device according to the embodiment of the present invention may further include the controller 130. The touch detection device according to the embodiment of the present invention may be integrated and implemented on a touch sensing integrated circuit (IC, not shown) in a touch input device 1000 including the touch sensor panel 100. The drive electrode TX and the receiving electrode RX included in the touch sensor panel 100 may be connected to the drive unit 120 and the sensing unit 110 included in the touch sensing IC through, for example, a conductive trace and/or a conductive pattern printed on a circuit board, or the like. The touch sensing IC may be located on a circuit board on which the conductive pattern has been printed. According to the embodiment, the touch sensing IC may be mounted on a main board for operation of the touch input device 1000.

As described above, a capacitance (C) with a predetermined value is generated at each crossing of the drive electrode TX and the receiving electrode RX. When an object like a finger approaches close to the touch sensor panel 100, the value of the capacitance may be changed. In FIG. 1, the capacitance may represent a mutual capacitance (Cm). The sensing unit 110 senses such electrical characteristics, thereby being able to sense whether the touch has occurred on the touch sensor panel 100 or not and where the touch has occurred. For example, the sensing unit 110 is able to sense whether the touch has occurred on the surface of the touch sensor panel 100 comprised of a two-dimensional plane consisting of a first axis and a second axis.

More specifically, when the touch occurs on the touch sensor panel 100, the drive electrode TX to which the driving signal has been applied is detected, so that the position of the second axial direction of the touch can be detected. Likewise, when the touch occurs on the touch sensor panel 100, the capacitance change is detected from the reception signal received through the receiving electrode RX, so that the position of the first axial direction of the touch can be detected.

The mutual capacitance type touch sensor panel as the touch sensor panel 100 has been described in detail in the foregoing. However, in the touch input device 1000 according to the embodiment of the present invention, the touch sensor panel 100 for detecting whether or not the touch has occurred and where the touch has occurred may be implemented by using not only the above-described method but also any touch sensing method like a self-capacitance type method, a surface capacitance type method, a projected capacitance type method, a resistance film method, a surface acoustic wave (SAW) method, an infrared method, an optical imaging method, a dispersive signal technology, and an acoustic pulse recognition method, etc.

Hereinafter, a component corresponding to the drive electrode TX and the receiving electrode RX for detecting whether or not the touch has occurred and/or the touch position can be referred to as a touch sensor.

In the pressure sensor and the touch input device 1000 to which the pressure detection module including the pressure sensor can be applied according to the embodiment of the present invention, the touch sensor panel 100 may be positioned outside or inside a display panel 200A. The display panel 200A of the touch input device 1000 according to the embodiment of the present invention may be a display panel included in a liquid crystal display (LCD), a plasma display panel (PDP), an organic light emitting diode (OLED), etc. Accordingly, a user may perform the input operation by touching the touch surface while visually identifying an image displayed on the display panel. Here, the display panel 200A may include a control circuit which receives an input from an application processor (AP) or a central processing unit (CPU) on a main board for the operation of the touch input device 1000 and displays the contents that the user wants on the display panel. Here, the control circuit for the operation of the display panel 200A may be mounted on a second printed circuit board (hereafter, referred to as a second PCB) (210) in FIGS. 10a to 12c. Here, the control circuit for the operation of the display panel 200A may include a display panel control IC, a graphic controller IC, and a circuit required to operate other display panels 200A.

FIGS. 2a to 2e are conceptual views showing a relative position of the touch sensor panel 100 with respect to the display panel 200A in the touch input device to which the pressure sensor 440 according to the embodiment can be applied. First, the relative position of the touch sensor panel 100 with respect to the display panel 200A using an LCD panel will be described with reference to FIGS. 2a to 2c.

As shown in FIGS. 2a to 2c, the LCD panel may include a liquid crystal layer 250 including a liquid crystal cell, a first substrate 261 and a second substrate 262 which are disposed on both sides of the liquid crystal layer 250 and include electrodes, a first polarizer layer 271 formed on a side of the first substrate 261 in a direction facing the liquid crystal layer 250, and a second polarizer layer 272 formed on a side of the second substrate 262 in the direction facing the liquid crystal layer 250. Here, the first substrate 261 may be color filter glass, and the second substrate 262 may be TFT glass. Also, the first substrate 261 and/or the second substrate 262 may be a plastic substrate.

It is clear to those skilled in the art that the LCD panel may further include other configurations for the purpose of performing the displaying function and may be transformed.

FIG. 2a shows that the touch sensor panel 100 of the touch input device 1000 is disposed outside the display panel 200A. The touch surface of the touch input device 1000 may be the surface of the touch sensor panel 100. In FIG. 2a, the top surface of the touch sensor panel 100 is able to function as the touch surface. Also, according to the embodiment, the touch surface of the touch input device 1000 may be the outer surface of the display panel 200A. In FIG. 2a, the bottom surface of the second polarizer layer 272 of the display panel 200A is able to function as the touch surface. Here, in order to protect the display panel 200A, the bottom surface of the display panel 200A may be covered with a cover layer (not shown) like glass.

FIGS. 2b and 2c show that the touch sensor panel 100 of the touch input device 1000 is disposed inside the display panel 200A. Here, in FIG. 2b, the touch sensor panel 100 for detecting the touch position is disposed between the first substrate 261 and the first polarizer layer 271. Here, the touch surface of the touch input device 1000 is the outer surface of the display panel 200A. The top surface or bottom surface of the display panel 200A in FIG. 2b may be the touch surface. FIG. 2c shows that the touch sensor panel 100 for detecting the touch position is included in the liquid crystal layer 250, that is to say, the touch sensor panel 100 is disposed between the first substrate 261 and the second substrate 262. Here, the touch surface of the touch input device 1000 is the outer surface of the display panel 200A. The top surface or bottom surface of the display panel 200A in FIG. 2c may be the touch surface. In FIGS. 2b and 2c, the top surface or bottom surface of the display panel 200A, which can be the touch surface, may be covered with a cover layer (not shown) like glass.

Next, a relative position of the touch sensor panel 100 with respect to the display panel 200A using an OLED panel will be described with reference to FIGS. 2d and 2e. In FIG. 2d, the touch sensor panel 100 is positioned between a polarizer layer 282 and a first substrate 281. In FIG. 2e, the touch sensor panel 100 is positioned between an organic material layer 280 and a second substrate 283. Also, the touch sensor panel 100 is positioned between the first substrate 281 and the organic material layer 280.

Here, the first substrate 281 may be made of encapsulation glass. The second substrate 283 may be made of TFT glass. Also, the first substrate 281 and/or the second substrate 283 may be plastic substrates. Since the touch sensing has been described above, the other configurations only will be briefly described.

The OLED panel is a self-light emitting display panel which uses a principle where, when current flows through a fluorescent or phosphorescent organic thin film and then electrons and electron holes are combined in the organic material layer, so that light is generated. The organic matter constituting the light emitting layer determines the color of the light.

Specifically, the OLED uses a principle in which when electricity flows and an organic matter is applied on glass or plastic, the organic matter emits light. That is, the principle is that electron holes and electrons are injected into the anode and cathode of the organic matter respectively and are recombined in the light emitting layer, so that a high energy exciton is generated and the exciton releases the energy while falling down to a low energy state and then light with a particular wavelength is generated. Here, the color of the light is changed according to the organic matter of the light emitting layer.

The OLED includes a line-driven passive-matrix organic light-emitting diode (PM-OLED) and an individual driven active-matrix organic light-emitting diode (AM-OLED) in accordance with the operating characteristics of a pixel constituting a pixel matrix. None of them require a backlight. Therefore, the OLED enables a very thin display module to be implemented, has a constant contrast ratio according to an angle and obtains a good color reproductivity depending on a temperature. Also, it is very economical in that non-driven pixel does not consume power.

In terms of operation, the PM-OLED emits light only during a scanning time at a high current, and the AM-OLED maintains a light emitting state only during a frame time at a low current. Therefore, the AM-OLED has a resolution higher than that of the PM-OLED and is advantageous for driving a large area display panel and consumes low power. Also, a thin film transistor (TFT) is embedded in the AM-OLED, and thus, each component can be individually controlled, so that it is easy to implement a delicate screen.

As shown in FIGS. 2d and 2e, basically, the OLED (particularly, AM-OLED) panel includes the polarizer layer 282, the first substrate 281, the organic layer 280, and the second substrate 283. Here, the first substrate 281 may be made of encapsulation glass. The second substrate 283 may be made of TFT glass. However, they are not limited to this. The first substrate 281 and/or the second substrate 283 may be plastic substrates.

Also, the organic layer 280 may include a hole injection layer (HIL), a hole transport layer (HTL), an electron injection layer (EIL), an electron transport layer (ETL), and an emission material layer (EML).

Briefly describing each of the layers, HIL injects electron holes and is made of a material such as CuPc, etc. HTL functions to move the injected electron holes and mainly is made of a material having a good hole mobility. Arylamine, TPD, and the like may be used as the HTL. The EIL and ETL inject and transport electrons. The injected electrons and electron holes are combined in the EML and emit light. The EML represents the color of the emitted light and is composed of a host determining the lifespan of the organic matter and an impurity (dopant) determining the color sense and efficiency. This just describes the basic structure of the organic layer 280 include in the OLED panel. The present invention is not limited to the layer structure or material, etc., of the organic layer 280.

The organic layer 280 is inserted between an anode (not shown) and a cathode (not shown). When the TFT becomes an on-state, a driving current is applied to the anode and the electron holes are injected, and the electrons are injected to the cathode. Then, the electron holes and electrons move to the organic layer 280 and emit the light.

Also, according to the embodiment, at least a portion of the touch sensor may be disposed within the display panel 200A and at least the remaining portion of the touch sensor may be disposed outside the display panel 200A. For example, any one of the drive electrode TX and the receiving electrode RX which constitute the touch sensor panel 100 may be disposed outside the display panel 200A and the other may be disposed within the display panel 200A. When the touch sensor is disposed within the display panel 200A, an electrode for the operation of the touch sensor may be further added. In addition, various components and/or electrodes disposed within the display panel 200A can be also used as the touch sensor for touch sensing.

Also, according to the embodiment, at least a portion of the touch sensor may be disposed between the first substrate 261 and 281 and the second substrate 262 and 283 and at least the remaining portion of the touch sensor may be disposed on the first substrate 261 and 281. For example, any one of the drive electrode TX and the receiving electrode RX which constitute the touch sensor panel 100 may be disposed on the first substrate 261 and 281 and the other may be disposed between the first substrate 261 and 281 and the second substrate 262 and 283. Here, likewise, when the touch sensor is disposed between the first substrate 261 and 281 and the second substrate 262 and 283, an electrode for the operation of the touch sensor may be further added. In addition, various components and/or electrodes disposed between the first substrate 261 and 281 and the second substrate 262 and 283 can be also used as the touch sensor for touch sensing.

The second substrate 262 and 283 may be comprised of various layers including a data line a gate line, TFT, a common electrode, and a pixel electrode, etc. Specifically, when the display panel 200A is the LCD panel, these electrical components may operate in such a manner as to generate a controlled electric field and orient liquid crystals located in the liquid crystal layer 250. Any one of the data line, the gate line, the common electrode, and the pixel electrode included in the second substrate 262 and 283 may be configured to be used as the touch sensor.

The foregoing has described the touch input device 1000 including the touch sensor panel 100 capable of detecting whether or not the touch has occurred and/or the touch position. The pressure sensor 440 according to the embodiment of the present invention is applied to the aforementioned touch input device 1000, so that it is possible to easily detect a magnitude of a touch pressure as well as whether or not the touch has occurred and/or the touch position. Hereinafter, described in detail is an example of a case of detecting the touch pressure by applying the electrode sheet according to the embodiment of the present invention to the touch input device 1000. According to the embodiment, the touch input device to which the pressure detection module is applied may not have the touch sensor panel 100.

FIG. 3*a* is an exemplary cross sectional views of the pressure sensor including a pressure electrode according to the embodiment of the present invention. For example, the pressure sensor 440 may include an electrode layer 441 between a first insulation layer 470 and a second insulation layer 471. The electrode layer 441 may include a first electrode 450 and/or a second electrode 460. Here, the first insulation layer 470 and the second insulation layer 471 may be made of an insulating material like polyimide. The first electrode 450 and/or the second electrode 460 included in the electrode layer 441 may include a material like copper. In accordance with the manufacturing process of the pressure sensor 440, the electrode layer 441 and the second insulation layer 471 may be adhered to each other by means of an adhesive (not shown) like an optically clear adhesive (OCA). Also, the pressure electrodes 450 and 460 according to the embodiment may be formed by positioning a mask, which has a through-hole corresponding to a pressure electrode pattern, on the first insulation layer 470, and then by spraying a conductive material.

FIG. 4*a* is a cross sectional view of the touch input device of a first example, to which the pressure sensor and the pressure detection module according to the embodiment of the present invention can be applied.

The cross sectional view of the touch input device 1000 shown in FIG. 4*a* may be a cross sectional view of a portion of the touch input device 1000. As shown in FIG. 4*a*, the touch input device 1000 according to the embodiment of the present invention may include the display panel 200A, a backlight unit 200B disposed under the display panel 200A, and a cover layer 500 disposed on the display panel 200A. In the touch input device 1000 according to the embodiment, the pressure sensors 450 and 460 may be formed on a cover 240. In this specification, the display panel 200A and the backlight unit 200B are collectively referred to as a display module 200. FIG. 4*a* shows that the pressure sensors 450 and 460 are attached on the cover 240. However, according to the embodiment, the pressure sensors 450 and 460 can be also attached to a configuration which is included in the touch input device 1000 and performs the same or similar function as/to that of the cover 240.

The touch input device 1000 according to the embodiment of the present invention may include an electronic device including the touch screen, for example, a cell phone, a personal data assistant (PDA), a smart phone, a tablet personal computer, an MP3 player, a laptop computer, etc.

At least a portion of the touch sensor is included within the display panel 200A in the touch input device 1000 according to the embodiment. Also, according to the embodiment, the drive electrode and the receiving electrode which are for sensing the touch may be included within the display panel 200A.

FIG. 4*a* does not show separately the touch sensor panel 100. However, in the touch input device 1000 according to the first example of the present invention, the lamination is made by an adhesive like the optically clear adhesive (OCA) between the touch sensor panel 100 and the display module 200 for detecting the touch position. As a result, the display color clarity, visibility and optical transmittance of the display module 200, which can be recognized through the touch surface of the touch sensor panel 100, can be improved. Here, the cover layer 500 may be disposed on the touch sensor panel 100.

The cover layer 500 according to the embodiment may be comprised of a cover glass which protects the front side of the display panel 200A and forms the touch surface. As shown in FIG. 4*a*, the cover layer 500 may be formed wider than the display panel 200A.

Since the display panel 200A such as the LCD panel according to the embodiment performs a function of only blocking or transmitting the light without emitting light by itself, the backlight unit 200B may be required. For example, the backlight unit 200B is disposed under the display panel 200A, includes a light source and throws the light on the display panel 200A, so that not only brightness and darkness but also information having a variety of colors is displayed on the screen. Since the display panel 200A is a passive device, it is not self-luminous. Therefore, the rear side of the display panel 200A requires a light source having a uniform luminance distribution.

The backlight unit 200B according to the embodiment may include an optical layer 220 for illuminating the display panel 200A. The optical layer 220 will be described in detail with reference to FIG. 4*b*.

The backlight unit 200B according to the embodiment may include the cover 240. The cover 240 may be made of a metallic material. When a pressure is applied from the outside through the cover layer 500 of the touch input device 1000, the cover layer 500, the display module 200, etc., may be bent. Here, the bending causes a distance between the pressure sensor 450 and 460 and a reference potential layer located within the display module to be changed. The capacitance change caused by the distance change is detected through the pressure sensors 450 and 460, so that the magnitude of the pressure can be detected. Here, a pressure is applied to the cover layer 500 in order to precisely detect the magnitude of the pressure, the position of the pressure sensors 450 and 460 needs to be fixed without changing. Therefore, the cover 240 is able to perform a function of a support capable of fixing a pressure sensor without being relatively bent even by the application of pressure. According to the embodiment, the cover 240 is manufactured separately from the backlight unit 200B, and may be assembled together when the display module is manufactured.

In the touch input device 1000 according to the embodiment, a first air gap 210' may be included between the display panel 200A and the backlight unit 200B. This intends to protect the display panel 200A and/or the backlight unit 200B from an external impact. This first air gap 210' may be included in the backlight unit 200B.

The optical layer 220 and the cover 240, which are included in the backlight unit 200B, may be configured to be spaced apart from each other. A second air gap 230 may be provided between the optical layer 220 and the cover 240. The second air gap 230 may be required in order to ensure that the pressure sensors 450 and 460 disposed on the cover 240 does not contact with the optical layer 220, and in order to prevent that the optical layer 220 contacts with the pressure sensors 450 and 460 and deteriorates the performance of the optical layer 220 even though an external pressure is applied to the cover layer 500 and the optical layer 220, the display panel 200A, and the cover layer 500 are bent.

The touch input device 1000 according to the embodiment may further include supports 251 and 252 such that the display panel 200A, the backlight unit 200B, and the cover layer 500 are coupled to maintain a fixed shape. According to the embodiment, the cover 240 may be integrally formed with the support 251 and 252. According to the embodiment, the support 251 and 252 may form a portion of the backlight unit 200B.

The structure and function of the LCD panel 200A and the backlight unit 200B is a publicly known art and will be briefly described below. The backlight unit 200B may include several optical parts.

FIG. 4b shows the optical layer 220 of the backlight unit 200B in the touch input device according to the embodiment. FIG. 4b shows the optical layer 220 when the LCD panel is used as the display panel 200A.

In FIG. 4b, the optical layer 220 of the backlight unit 200B may include a reflective sheet 221, a light guide plate 222, a diffuser sheet 223, and a prism sheet 224. Here, the backlight unit 200B may include a light source (not shown) which is formed in the form of a linear light source or point light source and is disposed on the rear and/or side of the light guide plate 222.

The light guide plate 222 may generally convert lights from the light source (not shown) in the form of a linear light source or point light source into light from a light source in the form of a surface light source, and allow the light to proceed to the LCD panel 200A.

A part of the light emitted from the light guide plate 222 may be emitted to a side opposite to the LCD panel 200A and be lost. The reflective sheet 221 may be positioned below the light guide plate 222 so as to cause the lost light to be incident again on the light guide plate 222, and may be made of a material having a high reflectance.

The diffuser sheet 223 functions to diffuse the light incident from the light guide plate 222. For example, light scattered by the pattern of the light guide plate 222 comes directly into the eyes of the user, and thus, the pattern of the light guide plate 222 may be shown as it is. Moreover, since such a pattern can be clearly sensed even after the LCD panel 200A is mounted, the diffuser sheet 223 is able to perform a function to offset the pattern of the light guide plate 222.

After the light passes through the diffuser sheet 223, the luminance of the light is rapidly reduced. Therefore, the prism sheet 224 may be included in order to improve the luminance of the light by focusing the light again. The prism sheet 224 may include, for example, a horizontal prism sheet and a vertical prism sheet.

The backlight unit 200B according to the embodiment may include a configuration different from the above-described configuration in accordance with the technical change and development and/or the embodiment. The backlight unit 200B may further include an additional configuration as well as the foregoing configuration. Also, in order to protect the optical configuration of the backlight unit 200B from external impacts and contamination, etc., due to the introduction of the alien substance, the backlight unit 200B according to the embodiment may further include, for example, a protection sheet on the prism sheet 224. The backlight unit 200B may also further include a lamp cover in accordance with the embodiment so as to minimize the optical loss of the light source. The backlight unit 200B may also further include a frame which maintains a shape enabling the light guide plate 222, the diffuser sheet 223, the prism sheet 224, a lamp (not shown), and the like, which are main components of the backlight unit 200B, to be exactly combined together in accordance with an allowed dimension. Also, the each of the configurations may be comprised of at least two separate parts.

According to the embodiment, an additional air gap may be positioned between the light guide plate 222 and the reflective sheet 221. As a result, the lost light from the light guide plate 222 to the reflective sheet 221 can be incident again on the light guide plate 222 by the reflective sheet 221.

Here, between the light guide plate 222 and the reflective sheet 221, for the purpose of maintaining the additional air gap, the double-sided adhesive tape (DAT) may be included on the edges of the light guide plate 222 and the reflective sheet 221.

As described above, the backlight unit 200B and the display module including the backlight unit 200B may be configured to include in itself the air gap such as the first air gap 210' and/or the second air gap 230. Also, the air gap may be included between a plurality of the layers included in the optical layer 220. Although the foregoing has described that the LCD panel 200A is used, the air gap may be included within the structure of another display panel.

FIG. 4c is a cross sectional view of the touch input device of a second example, to which the pressure sensor and pressure detection module according to the embodiment of the present invention can be applied. FIG. 4c shows a cross section of the touch input device 1000 that further includes a substrate 300 as well as the display module 200. In the touch input device 1000 according to the embodiment, the substrate 300, together with a second outermost cover 320 of the touch input device 1000, functions as, for example, a housing which surrounds a mounting space 310, etc., where the circuit board and/or battery for operation of the touch input device 1000 are located. Here, the circuit board for operation of the touch input device 1000 may be a main board. A central processing unit (CPU), an application processor (AP) or the like may be mounted on the circuit board. Due to the substrate 300, the display module 200 is separated from the circuit board and/or battery for operation of the touch input device 1000. Due to the substrate 300, electrical noise generated from the display module 200 can be blocked. According to the embodiment, the substrate 300 may be referred to as a mid-frame in the touch input device 1000.

In the touch input device 1000, the cover layer 500 may be formed wider than the display module 200, the substrate 300, and the mounting space 310. As a result, the second cover 320 is formed in such a manner as to surround the display module 200, the substrate 300, and the mounting space 310 where the circuit board is located. Also, according to the embodiment, the pressure sensor 440 may be included between the display module 200 and the substrate 300.

As with FIG. 4a, FIG. 4c does not show separately the touch sensor panel 100. However, the touch input device 1000 according to the embodiment of the present invention can detect the touch position through the touch sensor panel 100. Also, according to the embodiment, at least a portion of the touch sensor may be included in the display panel 200A.

Here, the pressure sensor 440 may be attached to the substrate 300, may be attached to the display module 200, or may be attached to the display module 200 and the substrate 300.

As shown in FIGS. 4a and 4c, since the pressure sensor 440 in the touch input device 1000 is disposed within the display module 200 or is disposed between the display module 200 and the substrate 300 and under the display module 200, the electrodes 450 and 460 included in the pressure sensor 440 can be made of not only a transparent material but also an opaque material.

Hereafter, in the touch input device 1000 according to the embodiment of the present invention, the principle and structure for detecting the magnitude of touch pressure by using the pressure sensor 440 will be described in detail. In FIGS. 5a to 5e, for convenience of description, the electrodes 450 and 460 included in the pressure sensor 440 are referred to as a pressure sensor.

FIGS. 5a and 5b show a relative distance between the reference potential layer and the pressure sensor of the first example, which are included in the touch input device, and show a pressure is applied to the touch input device. In the touch input device 1000 according to the embodiment of the present invention, the pressure sensors 450 and 460 may be attached on the cover 240 capable of constituting the backlight unit 200B. In the touch input device 1000, the pressure sensors 450 and 460 and the reference potential layer 600 may be spaced apart from each other by a distance "d".

In FIG. 5a, the reference potential layer 600 and the pressure sensor 450 and 460 may be spaced apart from each other with a spacer layer (not shown) placed therebetween. Here, as described with reference to FIGS. 4a and 4b, the spacer layer may be the first air gap 210', the second air gap 230, and/or an additional air gap which are included in the manufacture of the display module 200 and/or the backlight unit 200B. When the display module 200 and/or the backlight unit 200B includes one air gap, the one air gap is able to perform the function of the spacer layer. When the display module 200 and/or the backlight unit 200B includes a plurality of air gaps, the plurality of air gaps are able to collectively perform the function of the spacer layer.

In the touch input device 1000 according to the embodiment, the spacer layer may be located between the reference potential layer 600 and the pressure sensors 450 and 460. As a result, when a pressure is applied to the cover layer 500, the reference potential layer 600 is bent, so that a relative distance between the reference potential layer 600 and the pressure sensors 450 and 460 may be reduced. The spacer layer may be implemented by the air gap. According to the embodiment, the spacer layer 420 may be made of an impact absorbing material. Here, the impact absorbing material may include sponge and a graphite layer. The spacer layer 420 may be filled with a dielectric material in accordance with the embodiment. The spacer layer 420 may be formed through a combination of the air gap, the impact absorbing material, and the dielectric material.

In the touch input device 1000 according to the embodiment, the display module 200 may be bent or pressed by the touch applying the pressure. The display module may be bent or pressed in such a manner as to show the biggest transformation at the touch position. When the display module is bent or pressed according to the embodiment, a position showing the biggest transformation may not match the touch position. However, the display module may be shown to be bent or pressed at least at the touch position. For example, when the touch position approaches close to the border, edge, etc., of the display module, the most bent or pressed position of the display module may not match the touch position. The border or edge of the display module may not be shown to be bent very little depending on the touch.

Here, since the display module 200 in the touch input device 1000 according to the embodiment of the present invention may be bent or pressed by the application of the pressure, the components (a double-side adhesive tape, an adhesive tape 430, the supports 251 and 252, etc.) which are disposed at the border in order to maintain the air gaps 210 and 310 and/or the spacer layer 420 may be made of an inelastic material. That is, even though the components which are disposed at the border in order to maintain the air gaps 210 and 310 and/or the spacer layer 420 are not compressed or pressed, the touch pressure can be detected by the bending, etc., of the display module 200.

When the cover layer 500, the display panel 200A, and/or the back light unit 200B are bent or pressed at the time of touching the touch input device 1000 according to the embodiment, the cover 240 positioned below the spacer layer, as shown in FIG. 4b, may be less bent or pressed due to the spacer layer. While FIG. 5b shows that the cover 240 is not bent or pressed at all, this is just an example. The lowest portion of the cover 240 to which the pressure sensors 450 and 460 have been attached may be bent or pressed. However, the degree to which the lowest portion of the cover 240 is bent or pressed can be reduced by the spacer layer.

According to the embodiment, the spacer layer may be implemented in the form of the air gap. The spacer layer may be made of an impact absorbing material in accordance with the embodiment. The spacer layer may be filled with a dielectric material in accordance with the embodiment.

FIG. 5b shows that a pressure is applied to the structure of FIG. 5a. For example, when the external pressure is applied to the cover layer 500 shown in FIG. 4a, it can be seen that a relative distance between the reference potential layer 600 and the pressure sensors 450 and 460 is reduced from "d" to "d'". Accordingly, in the touch input device 1000 according to the embodiment, when the external pressure is applied, the reference potential layer 600 is configured to be more bent than the cover 240 to which the pressure sensors 450 and 460 have been attached, so that it is possible to detect the magnitude of touch pressure.

FIGS. 4a, 5a, and 5b show that a first electrode 450 and a second electrode 460 are included as the pressure sensors 450 and 460 for detecting the pressure. Here, the mutual capacitance may be generated between the first electrode 450 and the second electrode 460. Here, any one of the first and the second electrodes 450 and 460 may be a drive electrode and the other may be a receiving electrode. A driving signal is applied to the drive electrode, and a sensing signal may be obtained through the receiving electrode. When voltage is applied, the mutual capacitance may be generated between the first electrode 450 and the second electrode 460.

The reference potential layer 600 may have any potential which causes the change of the mutual capacitance generated between the first electrode 450 and the second electrode 460. For instance, the reference potential layer 600 may be a ground layer having a ground potential. The reference potential layer 600 may be any ground layer which is included in the display module. According to the embodiment, the reference potential layer 600 may be a ground potential layer which is included in itself during the manufacture of the touch input device 1000. For example, in the display panel 200A shown in FIGS. 2a to 2c, an electrode (not shown) for blocking noise may be included between the first polarizer layer 271 and the first substrate 261. This electrode for blocking the noise may be composed of ITO and may function as the ground. Also, according to the embodiment, a plurality of the common electrodes included in the display panel 200A constitutes the reference potential layer 600. Here, the potential of the common electrode may be a reference potential.

When a pressure is applied to the cover layer 500 by means of an object, at least a portion of the display panel 200A and/or the backlight unit 200B is bent, so that a relative distance between the reference potential layer 600 and the first and second electrodes 450 and 460 may be reduced from "d" to "d'". Here, the less the distance between the reference potential layer 600 and the first and second electrodes 450 and 460 is, the less the value of the mutual capacitance between the first electrode 450 and the second electrode 460 may be. This is because the distance between the reference potential layer 600 and the first and second electrodes 450 and 460 is reduced from "d" to "d'", so that a fringing capacitance of the mutual capacitance is absorbed in the reference potential layer 600 as well as in the object. When a nonconductive object touches, the change of the mutual capacitance is simply caused by only the change of the distance "d-d'" between the reference potential layer 600 and the electrodes 450 and 460.

The foregoing has described that the pressure sensor 440 includes the first electrode 450 and the second electrode 460 and the pressure is detected by the change of the mutual capacitance between the first electrode 450 and the second electrode 460. The pressure sensor 440 may be configured to include only any one of the first electrode 450 and the second electrode 460 (for example, the first electrode 450).

FIGS. 5*c* and 5*d* show a relative distance between a reference potential layer and a pressure sensor of a second example which are included in the touch input device, and show that a pressure is applied to the touch input device. Here, it is possible to detect the magnitude of touch pressure by detecting the self-capacitance between the first electrode 450 and the reference potential layer 600. Here, the change of the self-capacitance between the first electrode 450 and the reference potential layer 600 is detected by applying the driving signal to the first electrode 450 and by receiving the reception signal from the first electrode 450, so that the magnitude of the touch pressure is detected.

For example, the magnitude of the touch pressure can be detected by the change of the capacitance between the first electrode 450 and the reference potential layer 600, which is caused by the distance change between the reference potential layer 600 and the first electrode 450. Since the distance "d" is reduced with the increase of the touch pressure, the capacitance between the reference potential layer 600 and the first electrode 450 may be increased with the increase of the touch pressure.

FIGS. 4*a* and 5*a* to 5*d* show that the first electrode 450 and/or the second electrode 460 are relatively thick and they are directly attached to the cover 240. However, this is just only for convenience of description. In accordance with the embodiment, the first electrode 450 and/or the second electrode 460 is the integral sheet-type pressure sensor 440 may be attached to the cover 240 and may have a relatively small thickness.

Although the foregoing has described that the pressure sensor 440 is attached to the cover 240 by referencing the touch input device 1000 shown in FIG. 4*a*, the pressure sensor 440 may be disposed between the display module 200 and the substrate 300 in the touch input device 1000 shown in FIG. 4*c*. According to the embodiment, the pressure sensor 440 may be disposed under the display module 200. In this case, the reference potential layer 600 may be any potential layer which is disposed on the substrate 300 or within the display module 200. Also, according to the embodiment, the pressure sensor 440 may be attached to the substrate 300. In this case, the reference potential layer 600 may be any potential layer which is disposed on or within the display module 200.

FIG. 5*e* shows the arrangement of pressure sensors of a third example which is included in the touch input device. As shown in FIG. 5*e*, the first electrode 450 may be disposed on the substrate 300, and the second electrode 460 may be disposed under the display module 200. In this case, a separate reference potential layer may not be required. When a pressure touch is performed on the touch input device 1000, a distance between the display module 200 and the substrate 300 may be changed, and thus, the mutual capacitance between the first electrode 450 and the second electrode 460 may be increased. Through the capacitance change, the magnitude of the touch pressure can be detected. Here, the first electrode 450 and the second electrode 460 may be included in the first pressure sensor 440-1 and the second pressure sensor 440-2 respectively and attached to the touch input device 1000.

The foregoing has described that the reference potential layer 600 is located apart from the components to which the pressure sensor 440 is attached in the touch input device 1000. It will be described in FIGS. 6*a* to 6*c* that the component itself to which the pressure sensor 440 is attached in the touch input device 1000 functions as the reference potential layer.

FIG. 6*a* is a cross sectional view showing a portion of the touch input device to which the pressure sensor 440 has been attached according to a first method. FIG. 6*a* shows that the pressure sensor 440 has been attached on the substrate 300, the display module 200, or the cover 240.

As shown in FIG. 6*b*, the adhesive tape 430 having a predetermined thickness may be formed along the border of the pressure sensor 440 so as to maintain the spacer layer 420. Though FIG. 6*b* shows that the adhesive tape 430 is formed along the entire border (for example, four sides of a quadrangle) of the pressure sensor 440, the adhesive tape 430 may be formed only on at least a portion (for example, three sides of a quadrangle) of the border of the pressure sensor 440. Here, as shown in FIG. 6*b*, the adhesive tape 430 may not be formed on an area including the electrodes 450 and 460. As a result, when the pressure sensor 440 is attached to the substrate 300 or the display module 200 through the adhesive tape 430, the pressure electrodes 450 and 460 may be spaced apart from the substrate 300 or the display module 200 at a predetermined distance. According to the embodiment, the adhesive tape 430 may be formed on the top surface of the substrate 300, the bottom surface of the display module 200, the surface of the cover 240. Also, the adhesive tape 430 may be a double adhesive tape. FIG. 6*b* shows only one of the pressure electrodes 450 and 460.

FIG. 6*c* is a partial cross sectional view of the touch input device to which the pressure sensor has been attached according to a second method. In FIG. 6*c*, after the pressure sensor 440 is placed on the substrate 300, the display module 200, or the cover 240, the pressure sensor 440 may be fixed to the substrate 300, the display module 200, or the cover 240 by means of the adhesive tape 430. For this, the adhesive tape 430 may come in contact with at least a portion of the pressure sensor 440 and at least a portion of the substrate 300, the display module 200, or the cover 240. FIG. 6*c* shows that the adhesive tape 430 continues from the top of the pressure sensor 440 to the exposed surface of the substrate 300, the display module 200, or the cover 240. Here, only a portion of the adhesive tape 430, which contacts with the pressure sensor 440, may have adhesive strength. Therefore, in FIG. 6*c*, the top surface of the adhesive tape 430 may not have the adhesive strength.

As shown in FIG. 6*c*, even if the pressure sensor 440 is fixed to the substrate 300, the display module 200, or the cover 240 by using the adhesive tape 430, a predetermined space, i.e., air gap may be created between the pressure sensor 440 and the substrate 300, the display module 200, or the cover 240. This is because the substrate 300, the display module 200, or the cover 240 is not directly attached to the pressure sensor 440 by means of the adhesive and because the pressure sensor 440 includes the pressure electrodes 450 and 460 having a pattern, so that the surface of the pressure sensor 440 may not be flat. The air gap of FIG. 6c may also function as the spacer layer 420 for detecting the touch pressure.

FIGS. 7a to 7e show pressure electrode patterns included in the pressure sensor for pressure detection according to the embodiment of the present invention. FIGS. 7a to 7c show the patterns of the first electrode 450 and the second electrode 460 included in the pressure sensor 440. The pressure sensor 440 including the pressure electrode patterns shown in FIGS. 7a to 7c may be formed on the cover 240, the substrate 300 or on the bottom surface of the display module 200. The capacitance between the first electrode 450 and the second electrode 460 may be changed depending on a distance between the reference potential layer 600 and the electrode layer including both the first electrode 450 and the second electrode 460.

When the magnitude of the touch pressure is detected as the mutual capacitance between the first electrode 450 and the second electrode 460 is changed, it is necessary to form the patterns of the first electrode 450 and the second electrode 460 so as to generate the range of the capacitance required to improve the detection accuracy. With the increase of a facing area or facing length of the first electrode 450 and the second electrode 460, the size of the capacitance that is generated may become larger. Therefore, the pattern can be designed by adjusting the size of the facing area, facing length and facing shape of the first electrode 450 and the second electrode 460 in accordance with the range of the necessary capacitance. FIGS. 7b to 7c show that the first electrode 450 and the second electrode 460 are formed in the same layer, and show that the pressure electrode is formed such that the facing length of the first electrode 450 and the second electrode 460 becomes relatively longer. The patterns of the pressure electrodes 450 and 460 shown in FIGS. 7b to 7c can be used to detect the pressure in the principle described in FIGS. 5a and 5c.

The electrode pattern shown in FIG. 7d can be used to detect the pressure in the principle described in FIGS. 5c and 5d. Here, the pressure electrode should not necessary have a comb teeth shape or a trident shape, which is required to improve the detection accuracy of the mutual capacitance change amount. The pressure electrode may have, as shown in FIG. 7d, a plate shape (e.g., quadrangular plate).

The electrode pattern shown in FIG. 7e can be used to detect the pressure in the principle described in FIG. 5e. Here, as shown in FIG. 7e, the first electrode 450 and the second electrode 460 are disposed orthogonal to each other, so that the capacitance change amount detection sensitivity can be enhanced.

FIGS. 8a and 8b show a relation between a magnitude of a touch pressure and a saturated area in the touch input device to which the pressure sensor 440 has been applied according to the embodiment of the present invention. Although FIGS. 8a and 8b show that the pressure sensor 440 is attached to the substrate 300, the following description can be applied in the same manner to a case where the pressure sensor 440 is attached to the display module 200 or the cover 240.

The touch pressure with a sufficient magnitude makes a state where the distance between the pressure sensor 440 and the substrate 300 cannot be reduced any more at a predetermined position. Hereafter, the state is designated as a saturation state. For instance, as shown in FIG. 8a, when the touch input device 1000 is pressed by a force "f", the pressure sensor 440 contacts the substrate 300, and thus, the distance between the pressure sensor 440 and the substrate 300 cannot be reduced any more. Here, as shown on the right of FIG. 8a, the contact area between the pressure sensor 440 and the substrate 300 may be indicated by "a".

However, in this case, when the magnitude of the touch pressure becomes larger, the contact area between the pressure sensor 440 and the substrate 300 in the saturation state where the distance between the pressure sensor 440 and the substrate 300 cannot be reduced any more may become greater. For example, as shown in FIG. 8b, when the touch input device 1000 is pressed by a force "F" greater than the force "f", the contact area between the pressure sensor 440 and the substrate 300 may become greater. As shown on the right of FIG. 8a, the contact area between the pressure sensor 440 and the substrate 300 may be indicated by "A". As such, the greater the contact area, the more the mutual capacitance between the first electrode 450 and the second electrode 460 may be reduced. Hereafter, it will be described that the magnitude of the touch pressure is calculated by the change of the capacitance according to the distance change. This may include that the magnitude of the touch pressure is calculated by the change of the saturation area in the saturation state.

FIGS. 8a and 8b are described with reference to the example shown in FIG. 6a. It is apparent that the description with reference to FIGS. 8a and 8b can be applied in the same manner to the examples described with reference to FIGS. 4a, 4c, 5a to 5e, and 6c. More specifically, the magnitude of the touch pressure can be calculated by the change of the saturation area in the saturation state where the distance between the pressure sensor 440 and either the ground layer or the reference potential layer 600 cannot be reduced any more.

The top surface of the substrate 300 may also have the ground potential in order to block the noise. FIG. 9 shows the cross sections of the pressure sensor according to the embodiment of the present invention. Referring to (a) of FIG. 9, a cross section when the pressure sensor 440 including the pressure electrodes 450 and 460 is attached to the substrate 300 or the display module 200 is shown. Here, in the pressure sensor 440, since the pressure electrodes 450 and 460 are disposed between the first insulation layer 470 and the second insulation layer 471, a short-circuit can be prevented from occurring between the pressure electrodes 450 and 460 and either the substrate 300 or the display module 200. Also, depending on the kind and/or implementation method of the touch input device 1000, the substrate 300 or the display module 200 on which the pressure electrodes 450 and 460 are attached may not have the ground potential or may have a weak ground potential. In this case, the touch input device 1000 according to the embodiment of the present may further include a ground electrode (not shown) between the first insulation layer 470 and either the substrate 300 or the display module 200. According to the embodiment, another insulation layer (not shown) may be included between the ground electrode and either the substrate 300 or the display module 200. Here, the ground electrode (not shown) is able to prevent the size of the capacitance generated between the first electrode 450 and the second electrode 460, which are pressure electrodes, from increasing excessively.

Cross sections of a portion of the pressure sensor attached to the touch input device in accordance with the embodiment of the present invention are shown in (a) to (d) of FIG. 9.

For example, when the first electrode 450 and the second electrode 460 included in the pressures sensor 440 are formed in the same layer, the pressure sensor 440 may be configured as shown in (a) of FIG. 9. Here, each of the first electrode 450 and the second electrode 460 shown in (a) of FIG. 9 may be, as shown in FIG. 13a, composed of a plurality of lozenge-shaped electrodes. Here, the plurality of the first electrodes 450 are connected to each other in a first axial direction, and the plurality of the second electrodes 460 are connected to each other in a second axial direction orthogonal to the first axial direction. The lozenge-shaped electrodes of at least one of the first and the second electrodes 450 and 460 are connected to each other through a bridge, so that the first electrode 450 and the second electrode 460 may be insulated from each other. Also, the first electrode 450 and the second electrode 460 shown in (a) of FIG. 9 may be composed of an electrode having a form shown in FIG. 13b.

In the pressure sensor 440, it can be considered that the first electrode 450 and the second electrode 460 are formed in different layers in accordance with the embodiment and form the electrode layer. A cross section when the first electrode 450 and the second electrode 460 are formed in different layers is shown in (b) of FIG. 9. As shown in (b) of FIG. 9, the first electrode 450 may be formed on the first insulation layer 470, and the second electrode 460 may be formed on the second insulation layer 471 positioned on the first electrode 450. According to the embodiment, the second electrode 460 may be covered with a third insulation layer 472. In other words, the pressure sensor 440 may include the first to the third insulation layers 470 to 472, the first electrode 450, and the second electrode 460. Here, since the first electrode 450 and the second electrode 460 are disposed in different layers, they can be implemented so as to overlap each other. For example, the first electrode 450 and the second electrode 460 may be, as shown in FIG. 13c, formed similarly to the pattern of the drive electrode TX and receiving electrode RX which are arranged in the form of M×N array. Here, M and N may be natural numbers greater than 1. Also, as shown in FIG. 13a, the lozenge-shaped first and the second electrodes 450 and 460 may be disposed in different layers respectively.

A cross section when the pressure sensor 440 is formed to include only the first electrode 450 is shown in (c) of FIG. 9. As shown in (c) of FIG. 9, the pressure sensor 440 including the first electrode 450 may be disposed on the substrate 300 or on the display module 200. For example, the first electrode 450 may be disposed as shown in FIG. 12d.

A cross section when the first pressure sensor 440-1 including the first electrode 450 is attached to the substrate 300 and the second pressure sensor 440-2 including the second electrode 460 is attached to the display module 200 is shown in (d) of FIG. 9. As shown in (d) of FIG. 9, the first pressure sensor 440-1 including the first electrode 450 may be disposed on the substrate 300. Also, the second pressure sensor 440-2 including the second electrode 460 may be disposed on the bottom surface of the display module 200.

As with the description related to (a) of FIG. 9, when substrate 300, the display module 200, or the cover 240 on which the pressure sensors 450 and 460 are attached may not have the ground potential or may have a weak ground potential, the pressure sensor 440 may further include, as shown in (a) to (d) of FIG. 9, a ground electrode (not shown) under the first insulation layers 470, 470-1, and 470-2 disposed to contact the substrate 300, the display module 200, or the cover 240. Here, the pressure sensor 440 may further include an additional insulation layer (not shown) which is opposite to the first insulation layers 470, 470-1, and 470-2 such that the ground electrode (not shown) is located between the additional insulation layer and the first insulation layers 470, 470-1, and 470-2.

The foregoing has described the case where the touch pressure is applied to the top surface of the touch input device 1000. However, even when the touch pressure is applied to the bottom surface of the touch input device 1000, the pressure sensor 440 is able to detect the touch pressure in the same manner.

As shown in FIGS. 4 to 9, in the case where the pressure sensor 440 according to the embodiment of the present invention is attached to the touch input device, when a pressure is applied to the touch input device by the object 500, the display module 200 or the substrate 300 is bent or pressed, so that the magnitude of the touch pressure can be calculated. Here, for the purpose of describing the change of the distance between the reference potential layer 600 and the pressure sensor 440, FIGS. 4 to 9 show that the display module 200, the substrate 300, or only a portion of the display module 200 to which the pressure is directly applied by the object 500 is bent or pressed. However, the member to which the pressure is not directly applied by the object 500 is also actually bent or pressed. However, since how much the member to which the pressure is directly applied is bent or pressed is more than how much the member to which the pressure is not directly applied is bent or pressed, the descriptions of FIGS. 4 to 9 are possible. As such, when the pressure is applied to the touch input device, the pressure sensor 440 attached to the touch input device may be also bent or pressed. Here, when the pressure applied to the touch input device is released, the display module 200 or the substrate 300 is restored to its original state, and thus, the pressure sensor 440 attached to the touch input device should also maintain its original shape. Also, when the original shape of the pressure sensor 440 is difficult to maintain, there may be difficulties in the process of attaching the pressure sensor 440 to the touch input device. Therefore, it is recommended that the pressure sensor 440 should have a rigidity to maintain its original shape.

When the pressure electrodes 450 and 460 included in the pressure sensor 440 are made of soft conductive metal such as Al, Ag, and Cu, the pressure electrodes 450 and 460 have a low rigidity and a thickness of only several micrometers. Therefore, the original shape of the pressure sensor 440 is difficult to maintain only by the pressure electrodes 450 and 460. Accordingly, it is recommended that the first insulation layer 470 or the second insulation layer 471 which is disposed on or under the pressure electrodes 450 and 460 has a rigidity enough to maintain the original shape of the pressure sensor 440.

Specifically, as shown in FIG. 3b, the pressure sensor 440 may include the electrode layer and support layers 470b and 471b. Here, the electrode layer may be composed of the pressure electrodes 450 and 460 including the first electrode 450 and the second electrode 460. In this case, the pressure sensor 440 may be used to detect the change of the capacitance between the first electrode 450 and the second electrode 460, which is changed according to a relative distance change between the electrode layer and the reference potential layer 600 which is disposed apart from the pressure sensor 440. Also, the electrode layer may be composed of the pressure electrodes 450 and 460 including only one electrode. In this case, the pressure sensor 440 may be used to detect the capacitance change between the electrode layer and the reference potential layer 600, which is changed according to the relative distance change between the electrode layer and the reference potential layer 600 which is disposed apart from the pressure sensor 440.

Here, when the reference potential layer 600 which is disposed apart from the pressure sensor 440 does not have a uniform reference potential according to each input position, or when the distance change between the reference potential layer and the electrode layer is not uniform for the pressure having the same magnitude in accordance with the input position, for example, when the surface of the reference potential layer 600 which is disposed apart from the pressure sensor 440 is not uniform, it may be difficult to use the capacitance change amount between the electrode layer and the reference potential layer 600 which is disposed apart from the pressure sensor 440. As shown in FIG. 3h, the pressure sensor 440 according to the embodiment of the present invention may include a first electrode layer including the first electrode 450 and include a second electrode layer which includes the second electrode 460 and is disposed apart from the first electrode layer. In this case, the pressure sensor 440 may be used to detect the capacitance change between the first electrode layer and the second electrode layer, which is changed according to a relative distance change between the first electrode layer and the second electrode layer. Here, any one of the first electrode layer and the second electrode layer may be the reference potential layer. As such, the capacitance change between the electrode layers is detected, which is changed according to the distance change between the electrode layers located within the pressure sensor 440, so that it is possible to detect a uniform capacitance change even when, as described above, the uniform capacitance change cannot be detected from the reference potential layer located outside the pressure sensor 440. Here, an elastic layer 480 which has a restoring force and absorbs the impact may be further included between the first electrode layer and the second electrode layer in order to provide uniformity of the distance change between the first electrode layer and the second electrode layer. Also, as shown in (d) of FIG. 9, the pressure sensor 440 may include the first pressure sensor including the first electrode layer and a first support layer and the second pressure sensor including the second electrode layer and a second support layer. In this case, the pressure sensor 440 may be used to detect the capacitance change between the first electrode layer and the second electrode layer, which is changed according to the relative distance change between the first electrode layer and the second electrode layer.

The support layers 470b and 471b may be made of a material, for example, a resin material, highly rigid metal, paper, or the like, which has a rigidity capable of maintaining the shape of the pressure sensor 440 even when the distance change occurs between the pressure sensor 440 and the reference potential layer 600.

The pressure sensor 440 may further include the first insulation layer 470 and the second insulation layer 471. Here, the electrode layer may be located between the first insulation layer 470 and the second insulation layer 471, and the support layers 470b and 471b may be included in at least any one of the first insulation layer 470 and the second insulation layer 472.

The first insulation layer 470 or the second insulation layer 471 may further include electrode covering layers 470a and 471a. The electrode covering layers 470a and 471a may function to insulate the electrode layer and may function to protect the electrode layer, for example, to prevent the electrode from being oxidized, scraped, cracked, or the like. Also, the electrode covering layers 470a and 471a are formed of or coated with a material with a color, thereby preventing the pressure sensor 440 from being degraded due to exposure to the sun during the distribution of the pressure sensor 440. Here, the electrode covering layers 470a and 471a may be adhered to the electrode layer or to the support layers 470b and 471b by means of an adhesive or may be printed or coated on the support layers 470b and 471b. The electrode covering layers 470a and 471a may be also made of a highly rigid resin material. However, since the thickness of the electrode covering layer is only several micrometers, it is difficult to maintain the original shape of the pressure sensor 440 of about 100 µm.

Also, as shown in FIGS. 3e and 3f, the pressure sensor 440 according to the embodiment of the present invention may further include the adhesive layer 430 and a protective layer 435 outside either the first insulation layer 470 or the second insulation layer 471. Though it has been described in FIGS. 4 to 9 that the adhesive layer 430 is formed separately from the pressure sensor 440, the adhesive layer 430 may be manufactured as one component included in the pressure sensor 440. The protective layer 435 functions to protect the adhesive layer 430 before the pressure sensor 440 is attached to the touch input device. When the pressure sensor 440 is attached to the touch input device, the protective layer 435 is removed and the pressure sensor 440 can be attached to the touch input device by using the adhesive layer 430.

As shown in FIG. 3c, the electrode covering layers 470a and 471a may not be formed on the side where the support layers 470b and 471b are formed. The support layers 470b and 471b made of a resin material, paper, or the like are able to insulate and protect the electrode layer. In this case, likewise, the support layers 470b and 471b may be formed of or coated with a material with a color.

As shown in FIG. 3d, any one of the first insulation layer 470 and the second insulation layer 471 may have a thickness less than that of the other. Specifically, since the capacitance (C) is inversely proportional to the distance "d" between the electrode layer and the reference potential layer 600, FIG. 3i shows that, for the same distance change, the smaller the distance between the electrode layer and the reference potential layer 600 is, the greater the capacitance change amount becomes, and then it becomes easier to precisely detect the pressure. Therefore, the pressure sensor 440 is attached to the touch input device including the cover 240, the substrate 300 and/or the display module 200, and the thickness of one of the first and second insulation layers 470 and 471, which is closer to the reference potential layer 600 than the other, may be less than that of the other.

Preferably, only one of the first and second insulation layers 470 and 471 may include the support layers 470b and 471b. Specifically, in the state where the pressure sensor 440 is attached to the touch input device, only one of the first and second insulation layers 470 and 471, which is farther from the reference potential layer 600 than the other, may include the support layers 470b and 471b.

Likewise, as shown in (d) of FIG. 9, when the first pressure sensor 440-1 is attached to the substrate 300 and the second pressure sensor 440-2 is attached to the display module 200, the thickness of the second insulation layer 471-1 which is closer to the first electrode 450 out of the first and the second insulation layers 470-1 and 471-1 may be less than the thickness of the first insulation layer 470-1, the thickness of the fourth insulation layer 471-2 which is closer to the second electrode 460 out of the third and the fourth insulation layers 470-2 and 471-2 may be less than the thickness of the third insulation layer 470-2. Preferably, only the first and the third insulation layers 470-1 and 470-2 may include the support layer 470b.

As shown in FIG. 3h, even when the pressure sensor 440 includes the first electrode layer including the first electrode 450 and the second electrode layer which includes the second electrode 460 and is disposed apart from the first electrode layer, the thickness of any one of the first insulation layer 470 and the second insulation layer 471 may be less than that of the other. Specifically, in a case where the pressure sensor 440 is attached to the display module 200 or the substrate 300, when a pressure is applied to the touch input device, a distance between the pressure sensor 440 and the member to which the pressure sensor 440 has been attached is not changed. However, a distance between the pressure sensor 440 and the member to which the pressure sensor 440 has been not attached is changed. Here, the capacitance change according to the distance change between the pressure sensor 440 and the reference potential layer 600 located outside the pressure sensor 440 is not desired. Thus, it is preferable to minimize such a capacitance change. Therefore, the pressure sensor 440 is attached to the touch input device including the substrate 300 and the display module 200 in such a manner as to be attached to any one of a side of the substrate 300, which is opposite to the display module 200 and a side of the display module 200, which is opposite to the substrate 300. In a state where the pressure sensor 440 is attached to the touch input device, the thickness of one of the first and second insulation layers 470 and 471, which is closer to the side to which the pressure sensor 440 has been attached than the other, may be less than that of the other.

Preferably, only one of the first and second insulation layers 470 and 471 may include the support layers 470b and 471b. Specifically, in the state where the pressure sensor 440 is attached to the touch input device, only one of the first and second insulation layers 470 and 471, which is farther from the side to which the pressure sensor 440 has been attached than the other, may include the support layers 470b and 471b.

The pressure sensor 440 shown in FIG. 3e is attached to the cover 240, the substrate 300 or the display module 200 toward the side on which the adhesive layer 430 is formed. The pressure sensor 440 shown in FIG. 3e is used to detect the magnitude of the pressure according to the distance change between the electrode layer and the reference potential layer 600 formed in or on the member to which the pressure sensor 440 has not been attached. The pressure sensor 440 shown in FIG. 3f is attached to the cover 240, the substrate 300 or the display module 200 toward the side on which the adhesive layer 430 is formed. The pressure sensor 440 shown in FIG. 3f is used to detect the magnitude of the pressure according to the distance change between the electrode layer and the reference potential layer 600 formed in or on the member to which the pressure sensor 440 has been attached.

A space in which the pressure sensor 440 is disposed, for example, an interval between the display module 200 and the substrate 300 depends on the touch input device and is about 100 to 500 µm. The thicknesses of the pressure sensor 440 and the support layers 470b and 471b are limited according to the interval. As shown in FIG. 3g, when the pressure sensor is attached to the display module 200 and a distance between the display module 200 and the substrate 300 is 500 µm, it is desirable that the pressure sensor 440 has a thickness of 50 µm to 450 µm. If the thickness of the pressure sensor 440 is less than 50 µm, the thickness of the support layers 470b and 471b having a relatively high rigidity also becomes smaller, so that the original shape of the pressure sensor 440 is difficult to maintain. If the thickness of the pressure sensor 440 is larger than 450 µm, an interval between the pressure sensor 440 and the substrate 300, i.e., the reference potential layer, is significantly reduced below 50 µm, so that it is difficult to measure the pressure with a wide range.

The pressure sensor 440 is disposed in the touch input device. Therefore, as with the touch input device, the pressure sensor 440 is required to meet a given reliability under a predetermined condition, for example, temperature, humidity, etc. In order to meet the reliability that the appearance and characteristics are less changed under a harsh condition of 85 to −40° C., a humidity condition of 85%, etc., it is desirable that the support layers 470b and 471b are made of a resin material. Specifically, the support layers 470b and 471b may be formed of polyimide (PI) or polyethylene terephthalate (PET). Also, polyethylene terephthalate costs less than polyimide. The material constituting the support layers 470b and 471b may be determined in terms of cost and reliability.

As described above, in order to detect the pressure through the touch input device 1000 to which the pressure sensor 440 is applied according to the embodiment of the present invention, it is necessary to sense the capacitance change occurring in the pressure electrodes 450 and 460. Therefore, it is necessary for the driving signal to be applied to the drive electrode out of the first and second electrodes 450 and 460, and it is required to detect the touch pressure by the capacitance change amount by obtaining the sensing signal from the receiving electrode. According to the embodiment, it is possible to additionally include a pressure detection device in the form of a pressure sensing IC for the operation of the pressure detection. The pressure detection module (not shown) according to the embodiment of the present invention may include not only the pressure sensor 440 for pressure detection but also the pressure detection device.

In this case, the touch input device repeatedly has a configuration similar to the configuration of FIG. 1 including the drive unit 120, the sensing unit 110, and the controller 130, so that the area and volume of the touch input device 1000 increase.

According to the embodiment, the touch detection device 1000 may apply the driving signal for pressure detection to the pressure sensor 440 by using the touch detection device for the operation of the touch sensor panel 100, and may detect the touch pressure by receiving the sensing signal from the pressure sensor 440. Hereafter, the following description will be provided by assuming that the first electrode 450 is the drive electrode and the second electrode 460 is the receiving electrode.

For this, in the touch input device 1000 to which the pressure sensor 440 is applied according to the embodiment of the present invention, the driving signal may be applied to the first electrode 450 from the drive unit 120, and the second electrode 460 may transmit the sensing signal to the sensing unit 110. The controller 130 may perform the scanning of the touch sensor panel 100, and simultaneously perform the scanning of the touch pressure detection, or the controller 130 performs the time-sharing, and then may generate a control signal such that the scanning of the touch sensor panel 100 is performed in a first time interval and the scanning of the pressure detection is performed in a second time interval different from the first time interval.

Therefore, in the embodiment of the present invention, the first electrode 450 and the second electrode 460 should be electrically connected to the drive unit 120 and/or the sensing unit 110. Here, it is common that the touch detection device for the touch sensor panel 100 corresponds to the touch sensing IC 150 and is formed on one end of the touch sensor panel 100 or on the same plane with the touch sensor panel 100. The pressure electrode 450 and 460 included in the pressure sensor 440 may be electrically connected to the touch detection device of the touch sensor panel 100 by any method. For example, the pressure electrode 450 and 460 may be connected to the touch detection device through a connector by using the second PCB 210 included in the display module 200. For example, conductive traces 461 which electrically extend from the first electrode 450 and the second electrode 460 respectively may be electrically connected to the touch sensing IC 150 through the second PCB 210, etc.

FIGS. 10a to 10b show that the pressure sensor 440 including the pressure electrodes 450 and 460 is attached to the bottom surface of the display module 200. FIGS. 10a and 10b show the second PCB 210 on which a circuit for the operation of the display panel has been mounted is disposed on a portion of the bottom surface of the display module 200.

FIG. 10a shows that the pressure sensor 440 is attached to the bottom surface of the display module 200 such that the first electrode 450 and the second electrode 460 are connected to one end of the second PCB 210 of the display module 200. Here, the first electrode 450 and the second electrode 460 may be connected to the one end of the second PCB 210 by using a double conductive tape. Specifically, since the thickness of the pressure sensor 440 and an interval between the substrate 300 and the display module 200 where the pressure sensor 440 is disposed are very small, the thickness can be effectively reduced by connecting both the first electrode 450 and the second electrode 460 to the one end of the second PCB 210 by using the double conductive tape rather than by using a separate connector. A conductive pattern may be printed on the second PCB 210 in such a manner as to electrically connect the pressure electrodes 450 and 460 to a necessary component like the touch sensing IC 150, etc. The detailed description of this will be provided with reference to FIGS. 11a to 11c. An attachment method of the pressure sensor 440 including the pressure electrodes 450 and 460 shown in FIG. 10a can be applied in the same manner to the substrate 300 and the cover 240.

FIG. 10b shows that the pressure sensor 440 including the first electrode 450 and the second electrode 460 is not separately manufactured but is integrally formed on the second PCB 210 of the display module 200. For example, when the second PCB 210 of the display module 200 is manufactured, a certain area (not shown) is separated from the second PCB, and then not only the circuit for the operation of the display panel but also the pattern corresponding to the first electrode 450 and the second electrode 460 can be printed on the area. A conductive pattern may be printed on the second PCB 210 in such a manner as to electrically connect the first electrode 450 and the second electrode 460 to a necessary component like the touch sensing IC 150, etc.

FIGS. 11a to 11c show a method for connecting the pressure electrodes 450 and 460 included in the pressure sensor 440 to the touch sensing IC 150. In FIGS. 11a to 11c, the touch sensor panel 100 is included outside the display module 200. FIGS. 12a to 12c show that the touch detection device of the touch sensor panel 100 is integrated in the touch sensing IC 150 mounted on the first PCB 160 for the touch sensor panel 100.

FIG. 11a shows that the pressure electrodes 450 and 460 included in the pressure sensor 440 attached to the display module 200 are connected to the touch sensing IC 150 through a first connector 121. As shown in FIG. 11a, in a mobile communication device such as a smart phone, the touch sensing IC 150 is connected to the second PCB 210 for the display module 200 through the first connector 121. The second PCB 210 may be electrically connected to the main board through a second connector 224. Therefore, through the first connector 121 and the second connector 224, the touch sensing IC 150 may transmit and receive a signal to and from the CPU or AP for the operation of the touch input device 1000.

Here, while FIG. 11a shows that the pressure sensor 440 is attached to the display module 200 by the method shown in FIG. 10b, the first electrode 450 can be attached to the display module 200 by the method shown in FIG. 10a. A conductive pattern may be printed on the second PCB 210 in such a manner as to electrically connect the first electrode 450 and the second electrode 460 to the touch sensing IC 150 through the first connector 121.

FIG. 11b shows that the pressure electrodes 450 and 460 included in the pressure sensor 440 attached to the display module 200 are connected to the touch sensing IC 150 through a third connector 473. In FIG. 11b, the pressure electrodes 450 and 460 may be connected to the main board for the operation of the touch input device 1000 through the third connector 473, and in the future, may be connected to the touch sensing IC 150 through the second connector 224 and the first connector 121. Here, the pressure electrodes 450 and 460 may be printed on the additional PCB separated from the second PCB 210. Otherwise, according to the embodiment, the pressure electrodes 450 and 460 may be attached to the touch input device 1000 in the form of the pressure sensor 440 shown in FIGS. 3a to 3h and may be connected to the main board through the third connector 473 by extending the conductive trace, etc., from the pressure electrodes 450 and 460.

FIG. 11c shows that the pressure electrodes 450 and 460 are directly connected to the touch sensing IC 150 through a fourth connector 474. In FIG. 11c, the pressure electrodes 450 and 460 may be connected to the first PCB 160 through the fourth connector 474. A conductive pattern may be printed on the first PCB 160 in such a manner as to electrically connect the fourth connector 474 to the touch sensing IC 150. As a result, the pressure electrodes 450 and 460 may be connected to the touch sensing IC 150 through the fourth connector 474. Here, the pressure electrodes 450 and 460 may be printed on the additional PCB separated from the second PCB 210. The second PCB 210 may be insulated from the additional PCB so as not to be short-circuited with each other. Also, according to the embodiment, the pressure electrodes 450 and 460 may be attached to the touch input device 1000 in the form of the pressure sensor 440 shown in FIGS. 3a to 3h and may be connected to the first PCB 160 through the fourth connector 474 by extending the conductive trace, etc., from the pressure electrodes 450 and 460.

The connection method of FIGS. 11b and 11c can be applied to the case where the pressure sensor 440 including the pressure electrode 450 and 460 is formed on the substrate 300 or on the cover 240 as well as on the bottom surface of the display module 200.

FIGS. 11a to 11c have been described by assuming that a chip on board (COB) structure in which the touch sensing IC 150 is formed on the first PCB 160. However, this is just an example. The present invention can be applied to the chip on board (COB) structure in which the touch sensing IC 150 is mounted on the main board within the mounting space 310 of the touch input device 1000. It will be apparent to those skilled in the art from the descriptions of FIGS. 11a to 11c that the connection of the pressure electrodes 450 and 460 through the connector can be also applied to another embodiment.

The foregoing has described the pressure electrodes 450 and 460, that is to say, has described that the first electrode 450 constitutes one channel as the drive electrode and the second electrode 460 constitutes one channel as the receiving electrode. However, this is just an example. According to the embodiment, the drive electrode and the receiving electrode constitute a plurality of channels respectively. Here, a high-pressure detection accuracy of the touch can be obtained by the plurality of channels constituted by the drive electrode and the receiving electrode, and it is possible to detect multi pressure of a multi touch.

FIGS. 12a to 12d show that the pressure electrode of the present invention constitutes the plurality of channels. FIG. 12a shows that first electrodes 450-1 and 450-2 and second electrodes 460-1 and 460-2 constitute two channels respectively. FIG. 12a shows that all of the first electrodes 450-1 and 450-2 and the second electrodes 460-1 and 460-2 which constitute the two channels are included in one pressure sensor 440. FIG. 12b shows that the first electrode 450 constitutes two channels 450-1 and 450-2 and the second electrode 460 constitutes one channel. FIG. 12c shows the first electrode 450-1 to 450-5 constitute five channels and the second electrode 460-1 and 460-5 constitute five channels. Even in this case, all of the electrodes constituting the five channels may be also included in one pressure sensor 440. FIG. 12d shows that first electrodes 451 to 459 constitute nine channels and all of the first electrodes 451 to 459 are included in one pressure sensor 440.

As shown in FIGS. 12a to 12d and 13a to 13d, when the plurality of channels are formed, a conductive pattern which is electrically connected to the touch sensing IC 150 from each of the first electrode 450 and/or the second electrode 460 may be formed.

Here, described is a case in which the plurality of channels shown in FIG. 12d are constituted. In this case, since a plurality of conductive patterns 461 should be connected to the first connector 121 with a limited width, a width of the conductive pattern 461 and an interval between the adjacent conductive patterns 461 should be small. Polyimide is more suitable for a fine process of forming the conductive pattern 461 with such a small width and interval than polyethylene terephthalate. Specifically, the support layers 470b and 471b of the pressure sensor 440, in which the conductive pattern 461 is formed, may be made of polyimide. Also, a soldering process may be required to connect the conductive pattern 461 to the first connector 121. For a soldering process which is performed at a temperature higher than 300° C., polyimide resistant to heat is more suitable than polyethylene terephthalate relatively vulnerable to heat. Here, for the purpose of reducing production costs, a portion of the support layers 470b and 471b, in which the conductive pattern 461 is not formed, may be made of polyethylene terephthalate, and a portion of the support layers 470b and 471b, in which the conductive pattern 461 is formed, may be made of polyimide.

FIGS. 12a to 12d and 13a to 13d show that the pressure electrode constitutes a single or a plurality of channels. The pressure electrode may be comprised of a single or a plurality of channels by a variety of methods. While FIGS. 12a to 12d and 13a to 13d do not show that the pressure electrodes 450 and 460 are electrically connected to the touch sensing IC 150, the pressure electrodes 450 and 460 can be connected to the touch sensing IC 150 by the method shown in FIGS. 11a to 11c and other methods.

In the foregoing description, the first connector 121 or the fourth connector 474 may be a double conductive tape. Specifically, since the first connector 121 or the fourth connector 474 may be disposed at a very small interval, the thickness can be effectively reduced by using the double conductive tape rather than a separate connector. Also, according to the embodiment, the functions of the first connector 121 and the fourth connector 474 can be implemented by a Flex-on-Flex Bonding (FOF) method capable of achieving a small thickness.

Hereinafter, various methods in which the pressure sensor 440 detects the magnitude of the pressure of the touch on the basis of the capacitance change amount detected from the channel.

Example of First Method

FIG. 20a is a flowchart for describing an example of a method for detecting the magnitude of the touch pressure by using a plurality of channels in the touch input device according to the embodiment of the present invention.

When a pressure is applied to the touch surface (S10), the magnitude of the touch pressure is detected based on the sum of the change amounts of the capacitances detected in the respective channels (S20). For example, the magnitude of the touch pressure can be calculated based on the sum of the change amounts of the capacitances detected in the respective fifteen first electrodes 450 in the pressure sensor 440 shown in FIG. 13d. As such, by using a value obtained by adding the pressure magnitudes detected from the respective channels (or the capacitance values corresponding thereto) or an average value of the pressure magnitudes detected from the respective channels, the accuracy of the pressure magnitude detected by using the plurality of channels can be further improved than the accuracy of the pressure magnitude detected by using a single channel.

Example of Second Method

FIG. 14a is a view showing that a pressure is applied to a predetermined position in the pressure sensor shown in FIG. 13d. FIG. 14b is a cross sectional view showing a form in which the touch input device is bent when the touch pressure is applied to a touch surface corresponding to a position "A" of FIG. 14a. FIG. 14c is a cross sectional view showing a form in which the touch input device is bent when the touch pressure is applied to a touch surface corresponding to a position "C" of FIG. 14a.

When the touch pressure is applied to the touch surface corresponding to a position "A" shown in FIG. 14a, that is, when the touch pressure is applied to the central portion of the display module 200, the degree of bending of the display module 200 may be relatively high as shown in FIG. 14b. On the other hand, when the touch pressure is applied to the touch surface corresponding to a position "C" shown in FIG. 14a, that is, when the touch pressure is applied to the edge of the display module 200, the degree of bending of the display module 200 may be relatively small as shown in FIG. 14c. Specifically, as shown in FIGS. 14b and 14c, when the same touch pressure is applied, the distance d1 between the pressure electrode 450 and the position where the display module 200 is most bent when the touch pressure is applied to the central portion of the display module 200 may be smaller than the distance d2 between the pressure electrode 450 and the position where the display module 200 is most bent when the touch pressure is applied to the edge of the display module 200. Therefore, even though the same touch pressure is applied, the capacitance change amounts detected in the respective channels are different according to the position where the touch pressure is applied. Therefore, there is a requirement for a method capable of detecting a more accurate pressure value than the pressure value detected by using the magnitude of the pressure detected from each channel or by using the sum or average of the capacitances, which corresponds to the magnitude.

FIG. 20b is a flowchart for describing another example of a method for detecting the magnitude of the touch pressure by using a plurality of channels in the touch input device according to the embodiment of the present invention. FIG. 15 is a view showing a scaling factor assigned to each first electrode in the pressure sensor shown in FIG. 13d.

When a pressure is applied to the touch surface (S100), the magnitude of the touch pressure is detected based on the sum of values obtained by multiplying the change amount of the capacitance detected in each of the channels by a scaling factor assigned previously to each of the channels (S200). For example, as shown in FIG. 15, a scaling factor of 1 is assigned to the first electrode 450 located at the central portion of the display module 200, a scaling factor of 6 is assigned to the first electrodes 450 adjacent to the first electrode 450 located at the central portion, and scaling factors of 12 and 16 are respectively assigned to the first electrodes 450 located at the edge. As described above, when a smaller scaling factor is assigned to the channel corresponding to the central portion of the display module 200 and a larger scaling factor is assigned to the channel corresponding to the edge of the display module 200, the central portion of the display module 200 is, as shown in FIGS. 14b and 14c, bent more than the edge of the display module 200 when the same pressure is applied. Therefore, it is possible to offset that the change amount of the capacitance detected at the central portion of the display module 200 becomes greater than the change amount of the capacitance detected at the edge of the display module 200. As a result, a more accurate pressure value can be calculated.

Example of Third Method

FIG. 16a is a graph for describing, when the pressure is applied to the position shown in FIG. 14a, a relation between a volume change amount of the touch input device and the magnitude of the applied pressure. FIG. 16b is a cross sectional view showing the volume change amount of the touch input device shown in FIG. 14b. FIG. 16c is a cross sectional view showing the volume change amount of the touch input device shown in FIG. 14c.

When the same touch pressure is applied, a volume (hereinafter, referred to as volume change amount) at which the touch input device 1000 is deformed when the touch pressure is applied to the central portion of the display module 200 may be greater than the volume change amount of the touch input device 1000 when the touch pressure is applied to the edge of the display module 200. In other words, when the same touch pressure is applied to the touch surface corresponding to the positions "A", "B", and "C" shown in FIG. 14a, as shown in FIGS. 16a to 16c, the volume change amount of the touch input device 1000 when the touch pressure is applied to the position "A", the central portion of the display module 200, is greater than the volume change amount of the touch input device 1000 when the touch pressure is applied the position "C" located at the edge relative to the position "A" of the display module 200.

Here, when the touch pressure is applied to the same position, the magnitude of the applied pressure and the volume change amount of the touch input device 1000 have a linear relationship. In other words, when the touch pressures having different magnitudes are applied to any one of the positions "A", "B", and "C" shown in FIG. 14a, the volume change amount of the touch input device 1000 is, as shown in FIG. 16a, changed in proportion to the magnitude of the applied pressure.

Therefore, the magnitude of the pressure can be detected by estimating the volume change amount of the touch input device 1000.

First, when a pressure having a predetermined magnitude is applied to a predetermined touch position of the display module 200, a reference value corresponding to the touch position is stored in a memory (not shown) on the basis of the capacitance detected from each channel. In this case, the reference value may be the volume change amount of the touch input device 1000 calculated based on the capacitance detected from each channel. Alternatively, the reference value may be a normalized pressure value having a linear relationship with the volume change amount of the touch input device 1000, or may be a slope in the graph shown in FIG. 16a. Such a method is repeatedly performed for each touch position, and the reference value for all positions of the entire area of the display module 200 when a pressure having a predetermined magnitude is applied is stored in the memory. Here, since it is difficult to generate the reference value for all positions of the entire area of the display module 200, the reference value may be generated and stored only for a plurality of representative positions spaced apart by a predetermined interval. For example, the volume change amounts of 432 calculated based on each capacitance change amount detected when a pressure of 800 g is applied to each of the touch positions of 432 (18×24) spaced apart at regular intervals of the display module 200 may be stored in the memory.

Next, a method for detecting the magnitude of the touch pressure by using the reference value is shown.

FIG. 20c is a flowchart for describing further another example of a method for detecting the magnitude of the touch pressure by using a plurality of channels in the touch input device according to the embodiment of the present invention. FIG. 17a is a partial perspective view for describing a form in which the touch input device is deformed when the pressure is applied to the touch input device. FIG. 17b is a view for describing the estimation of the volume change amount of the touch input device when the pressure is applied to the touch input device. FIG. 17c is a cross sectional view of FIG. 17b.

When a pressure is applied to the touch surface (S1000), the touch position is detected (S2000), and a distance change corresponding to each channel is calculated from the change amount of the capacitance detected in each channel (S3000).

The value of capacitance detected in each channel depends on the configuration of the pressure electrode or the configuration of the circuit for sensing the touch pressure. However, when the touch pressure is applied, the value of capacitance can be represented by a function of the distance change "di" corresponding to each channel shown in FIG. 17c. Therefore, it is possible to calculate the distance change "di" corresponding to each channel by performing an inverse calculation on the capacitance value detected from each channel. Here, the distance change "di" corresponding to each channel means a distance which corresponds to each channel and at which the surface of the touch input device is deformed after the pressure is applied with respect to the time before the pressure is applied.

FIG. 18a shows an equivalent circuit of a device for sensing a pressure capacitance 11 between the first electrode 450 and the second electrode 460 when, as shown in FIGS. 13a to 13c, the first electrode 450 is composed of the drive electrode TX and the second electrode 460 is composed of the receiving electrode RX, so that the magnitude of the touch pressure is detected from the change of the mutual capacitance between the first electrode 450 and the second electrode 460. Here, a relational expression between the driving signal Vs and the output signal Vo can be expressed by the following equation (1).

$$v_o = -\frac{C_p}{C_{FB}} \cdot v_s \quad \text{Equation (1)}$$

Here, among the capacitance between the first electrode 450 and the second electrode 460, the capacitance which is lost as a reference potential layer is fringing capacitance. Here, the pressure capacitance 11 can be expressed as follows.

$$C_p = C_0 + C_{fringing} = C_0 + \alpha f(d) \quad \text{Equation (2)}$$

Here, Co is a fixed capacitance value generated between the first electrode 450 and the second electrode 460, and $C_{fringing}$ is a capacitance value generated by fringing effect between the first electrode 450 and the second electrode 460. The equation (2) represents the value of $C_{fringing}$ by the distance "d" and a coefficient "α". The fixed capacitance means a capacitance generated by the first electrode 450 and the second electrode 460 irrespective of the distance "d" between the reference potential layer and the electrode.

When a random pressure is applied to any position of the display module 200, the distance change "di" corresponding to each channel can be calculated by performing an inverse calculation on the capacitance change amounts detected in each of the channels, the equation (1), and the equation (2).

FIG. 18b shows an equivalent circuit of a device for sensing the capacitance 11 between the first electrode 450 and the reference potential layer when, as shown in FIG. 13d, the driving signal is applied to the first electrode 450 and the reception signal is detected from the first electrode 450, so that the magnitude of the touch pressure is detected from the change of the self-capacitance of the first electrode 450.

When a first switch 21 is turned on, a capacitor for sensing the pressure capacitance 11 is charged to a power supply voltage VDD to which one end of the first switch 21 is connected. When a third switch 23 is turned on immediately after the first switch 21 is turned off, the electric charges charged in the capacitor for sensing the pressure capacitance 11 are transferred to an amplifier 31 to obtain the output signal Vo corresponding thereto. When a second switch 22 is turned on, all the electric charges remaining in the capacitor for sensing the pressure capacitance 11 are discharged. When the third switch 23 is turned on immediately after the second switch 22 is turned off, the electric charges are transferred to the capacitor for sensing the pressure capacitance 11 through a feedback capacitor 32 to obtain the output signal corresponding thereto. Here, the output signal Vo of the circuit shown in FIG. 18b can be expressed by the following equation (3).

$$v_o = -\frac{C_p}{C_{FB}} \cdot V_{DD} \quad \text{Equation (3)}$$

$$v_o = -\frac{\varepsilon A}{C_{FB}} \cdot \frac{1}{d} \cdot V_{DD}$$

Here, ε is a dielectric constant $\varepsilon_o \varepsilon_r$ of the material filled between the first electrode 450 and the reference potential layer, and "A" is the area of the first electrode 450.

When a random pressure is applied to any position of the display module 200, the distance change "di" corresponding to each channel can be calculated by performing an inverse calculation on the capacitance change amounts detected in each of the channels and the equation (3).

The volume change amount of the touch input device is estimated by using the calculated distance change "di" corresponding to each channel (S4000). Specifically, when the touch pressure is applied, the surface of the touch input device 1000 is deformed as shown in FIG. 17a, and the volume change amount of the touch input device 1000 due to the deformation of the surface of the touch input device 1000 can be estimated as the sum of the volume change amounts corresponding to the respective channels shown in FIGS. 17b and 17c. Here, when the areas corresponding to the respective channels are the same, for example, when the areas of the first electrodes 450 shown in FIG. 13d are the same, the sum of the volume change amounts corresponding to the respective channels may be a value obtained by multiplying the sum of the distance changes "di" corresponding to the respective channels by the area "A" of the first one electrode 450.

Here, when the touch pressure is applied to a predetermined position, the magnitude of the applied pressure and the volume change amount of the touch input device 1000 have, as shown in FIG. 16a, a linear relationship. Therefore, the magnitude of the applied pressure is calculated on the basis of the estimated volume change amount of the touch input device 1000 and the reference value which is stored in the memory and corresponds to the touch position (S5000).

For example, when the estimated volume change amount of the touch input device 1000 is 1000 and the volume change amount stored in the memory as a reference value corresponding to the touch position for a pressure of 800 g is 2000, the magnitude of the applied pressure is 400 g.

Also, when the reference value corresponding to the input touch position is not stored in the memory, the pressure value can be calculated through various interpolations such as linear interpolation, bi-cubic interpolation, etc., by using the reference value which is stored in the memory and corresponds to a touch position adjacent to the input touch position.

FIG. 19a is a view for describing a case where a pressure is applied to a position of the pressure sensor shown in FIG. 14a, which corresponds to a position "D" of FIG. 19a. FIG. 19b is a graph for describing the calculation of the pressure value when the pressure is applied to the position "D" shown in FIG. 19a.

For example, when reference values corresponding to the position "A" and the position "B" shown in FIG. 19a are stored in the memory and when a reference value corresponding to the position "D" which is a mid-point between the position "A" and the position "B" is not stored in the memory, the reference value of the position "D" can be, as shown in FIG. 19b, estimated by linearly interpolating the reference values of the position "A" and the position "B", that is to say, by taking an intermediate value between the reference value of the position "A" and the reference value of the position "B". The magnitude of the pressure applied to the position "D" can be calculated by using the estimated reference value of the position "D".

The foregoing has described that the third method for detecting the touch pressure by using the plurality of channels. However, as shown in FIGS. 10a to 11c, the third method can be applied even when the pressure electrodes 450 and 460 constitute a single channel.

When a pressure is applied to the touch surface, the touch position is detected, and the distance change can be calculated from the change amount of the capacitance detected in the single channel.

The value of the capacitance detected in the single channel can be represented by a function of the distance change corresponding to the single channel. Therefore, the distance change corresponding to the single channel can be calculated by performing an inverse calculation on the capacitance value detected from the single channel.

When a random pressure is applied to any position of the display module 200, the distance change corresponding to the single channel can be calculated by performing an inverse calculation on the capacitance change amount detected in the single channel and the equations (1), (2) or (3).

The volume change amount of the touch input device is estimated by using the calculated distance change corresponding to the single channel. Specifically, when the touch pressure is applied, the volume change amount of the touch input device may be a value obtained by multiplying the distance change corresponding to the single channel by the areas of the single electrodes 450 and 460.

Here, when the touch pressure is applied to a predetermined position, the magnitude of the applied pressure and the volume change amount of the touch input device 1000 have, as shown in FIG. 16a, a linear relationship. Therefore, the magnitude of the applied pressure is calculated on the basis of the estimated volume change amount of the touch input device 1000 and the reference value which is stored in the memory and corresponds to the touch position.

As described above, by calculating the magnitude of the pressure on the basis of the volume change amount by the touch pressure, it is possible to detect a more accurate pressure magnitude. The accurate magnitude of the pressure can be detected even though the reference potential layer or the pressure sensor is deformed from its initial position.

Although the pressure sensor 440 having the type shown in FIG. 13d has been described above, the embodiment of the present invention is not limited to this. The embodiment of the present invention can be applied to a pressure sensor including the pressure electrode having the types shown in FIGS. 13a to 13c.

When the pressure sensor 440 is configured to form a plurality of channels, multi pressure of a multi touch can be detected. This can be performed, for example, by using the pressure magnitudes obtained from the channels of the pressure electrodes 450 and 460 disposed at a position corresponding to each of the multiple touch positions obtained from the touch sensor panel 100. Alternatively, when the pressure sensor 440 is configured to form a plurality of channels, the touch position can be directly detected by the pressure sensor 440, and multi pressure can be also detected by using the pressure magnitudes obtained from the channels of the pressure electrodes 450 and 460 disposed at the corresponding position.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

| REFERENCE NUMERALS | |
|---|---|
| 1000: touch input device | 100: touch sensor panel |
| 120: drive unit | 110: sensing unit |
| 130: controller | 200: display module |
| 300: substrate | 420: spacer layer |
| 440: pressure sensor | 450, 460: pressure electrode |
| 470: first insulation layer | 471: second insulation layer |
| 470a, 471a: electrode covering layer | |
| 470b, 471b: support layer | 430: adhesive layer |
| 435: protective layer | 480: elastic layer |

The invention claimed is:

1. A touch input device capable of detecting a pressure of a touch on a touch surface, the touch input device comprising:
a display module; and
a pressure sensor which is disposed at a position where a distance between the pressure sensor and a reference potential layer is changeable according to the touch on the touch surface,
wherein the distance is changeable according to a pressure magnitude of the touch,
wherein the pressure sensor outputs a signal comprising information on a capacitance which is changed according to the distance,
wherein the pressure sensor comprises a plurality of electrodes to form a plurality of channels,
wherein the pressure magnitude of the touch is detected on the basis of a change amount of the capacitance detected in each of the channels; and
wherein the pressure magnitude of the touch is detected based on a sum of values obtained by multiplying the change amount of the capacitance detected in each of the channels by a scaling factor assigned previously to each of the channels.

2. The touch input device of claim 1, wherein the scaling factor assigned to the channel corresponding to a central portion of the display module is smaller than the scaling factor assigned to the channel corresponding to an edge of the display module.

3. The touch input device of claim 1, further comprising a substrate under the display module, wherein the pressure sensor is attached to the substrate or the display module.

4. The touch input device of claim 3, wherein the reference potential layer is the substrate or the display module.

5. The touch input device of claim 1, wherein the reference potential layer is disposed within the display module.

6. The touch input device claim 1, wherein the capacitance is a capacitance between the electrode and the reference potential layer.

7. The touch input device of claim 1,
wherein the electrode comprises a first electrode and a second electrode,
and wherein the capacitance is a capacitance between the first electrode and the second electrode.

8. The touch input device of claim 1,
wherein the display module comprises:
a display panel; and
a backlight unit which is disposed under the display panel and comprises a reflective sheet and a cover, and wherein the pressure sensor is attached to the cover, between the reflective sheet and the cover.

9. The touch input device of claim 8, wherein the reference potential layer is located within the display panel.

10. The touch input device of claim 9, wherein a plurality of common electrodes within the display panel constitutes the reference potential layer.

11. The touch input device of claim 1, wherein the touch input device is configured such that the pressure of each touch of a multi touch is detectable through the pressure sensor.

12. A touch input device capable of detecting a pressure of a touch on a touch surface, the touch input device comprising:
a display module; and
a pressure sensor which is disposed at a position where a distance between the pressure sensor and a reference potential layer is changeable according to the touch on the touch surface,
wherein the distance is changeable according to a pressure magnitude of the touch,
wherein the pressure sensor outputs a signal comprising information on a capacitance which is changed according to the distance,
wherein the pressure sensor comprises a plurality of electrodes to form a plurality of channels,
wherein the pressure magnitude of the touch is detected on the basis of a change amount of the capacitance detected in each of the channels; and
wherein a volume change amount of the touch input device is estimated based on the change amount of the capacitance detected in each of the channels,
and wherein the pressure magnitude of the touch is detected based on the estimated volume change amount.

13. The touch input device of claim 12, wherein the pressure magnitude of the touch is detected based on the estimated volume change amount and a reference value corresponding to a previously stored predetermined touch position.

14. The touch input device of claim 12, wherein the volume change amount of the touch input device is estimated by calculating a distance change corresponding to each of the channels from the change amount of the capacitance detected in each of the channels.

15. A touch input device capable of detecting a pressure of a touch on a touch surface, the touch input device comprising:
a display module; and
a pressure sensor which is disposed at a position where a distance between the pressure sensor and a reference potential layer is changeable according to the touch on the touch surface,
wherein the distance is changeable according to a pressure magnitude of the touch,
wherein the pressure sensor outputs a signal comprising information on a capacitance which is changed according to the distance,
wherein the pressure sensor comprises an electrode forming a single channel,
wherein a volume change amount of the touch input device is estimated from a change amount of the capacitance detected in the single channel,
and wherein the pressure magnitude of the touch is detected on the basis of the estimated volume change amount.

16. The touch input device of claim 15, wherein the pressure magnitude of the touch is detected based on the estimated volume change amount and a reference value corresponding to a previously stored predetermined touch position.

17. The touch input device of claim 15, wherein the volume change amount of the touch input device is estimated by calculating a distance change corresponding to the single channel from the change amount of the capacitance detected in the single channel.

* * * * *